United States Patent
Lee et al.

(10) Patent No.: US 8,642,438 B2
(45) Date of Patent: Feb. 4, 2014

(54) METHOD OF MANUFACTURING AN INTEGRATED CIRCUIT DEVICE

(75) Inventors: Young-Ho Lee, Hwaseong-si (KR); Keon-Soo Kim, Hwaseong-si (KR); Seong-Soon Cho, Suwon-si (KR); Jin-Hyun Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/324,035

(22) Filed: Dec. 13, 2011

(65) Prior Publication Data

US 2012/0178234 A1   Jul. 12, 2012

(30) Foreign Application Priority Data

Jan. 11, 2011   (KR) .................. 10-2011-0002546

(51) Int. Cl.
*H01L 21/20* (2006.01)
*H01L 21/00* (2006.01)

(52) U.S. Cl.
USPC ............... 438/382; 438/381; 257/E21.001

(58) Field of Classification Search
USPC ................................................ 438/381–399
See application file for complete search history.

(56) References Cited

U.S. PATENT DOCUMENTS

| | | | | |
|---|---|---|---|---|
| 3,683,491 A * | 8/1972 | Nelson et al. | ................. | 438/382 |
| 4,893,166 A * | 1/1990 | Geekie | .................. | 257/536 |
| 5,081,421 A * | 1/1992 | Miller et al. | ................. | 324/671 |
| 6,781,193 B2 * | 8/2004 | Lee et al. | ................. | 257/326 |
| 7,858,467 B2 * | 12/2010 | Kamioka et al. | ............. | 438/221 |
| 8,030,738 B2 * | 10/2011 | Shin | .............................. | 257/538 |
| 8,377,763 B2 * | 2/2013 | Kanike | .................... | 438/155 |
| 2004/0014275 A1 * | 1/2004 | Hasegawa et al. | ............ | 438/227 |
| 2005/0170596 A1 * | 8/2005 | Kim | .............................. | 438/305 |
| 2005/0202606 A1 * | 9/2005 | Park et al. | .................... | 438/156 |
| 2006/0043496 A1 * | 3/2006 | Kunimasa et al. | ............ | 257/388 |
| 2006/0054953 A1 | 3/2006 | Son et al. | | |
| 2007/0032056 A1 * | 2/2007 | Iida | .............................. | 438/585 |
| 2007/0093015 A1 * | 4/2007 | Kudo et al. | .................... | 438/199 |
| 2007/0187776 A1 | 8/2007 | Sasaki | | |
| 2009/0278189 A1 * | 11/2009 | Cho et al. | .................... | 257/316 |
| 2009/0286378 A1 | 11/2009 | Hase | | |
| 2010/0019344 A1 * | 1/2010 | Chuang et al. | ................ | 257/516 |
| 2010/0078645 A1 * | 4/2010 | Kurz et al. | ...................... | 257/66 |
| 2010/0112764 A1 * | 5/2010 | Mehrotra et al. | ............. | 438/210 |
| 2011/0062508 A1 * | 3/2011 | Park et al. | .................... | 257/316 |
| 2011/0303982 A1 * | 12/2011 | Chung et al. | .................. | 257/363 |
| 2011/0318897 A1 * | 12/2011 | Shang et al. | .................. | 438/382 |

FOREIGN PATENT DOCUMENTS

| | | |
|---|---|---|
| JP | 2007-214208 | 8/2007 |
| JP | 2009-283497 | 12/2009 |
| KR | 10-2006-0024998 | 3/2006 |

* cited by examiner

*Primary Examiner* — Scott B Geyer
*Assistant Examiner* — Evren Seven
(74) *Attorney, Agent, or Firm* — Stanzione & Kim, LLP

(57) ABSTRACT

In an integrated circuit device and method of manufacturing the same, a resistor pattern is positioned on a device isolation layer of a substrate. The resistor pattern includes a resistor body positioned in a recess portion of the device isolation layer and a connector making contact with the resistor body and positioned on the device isolation layer around the recess portion. The connector has a metal silicide pattern having electric resistance lower than that of the resistor body at an upper portion. A gate pattern is positioned on the active region of the substrate and includes the metal silicide pattern at an upper portion. A resistor interconnection is provided to make contact with the connector of the resistor pattern. A contact resistance between the connector and the resistor interconnection is reduced.

18 Claims, 20 Drawing Sheets

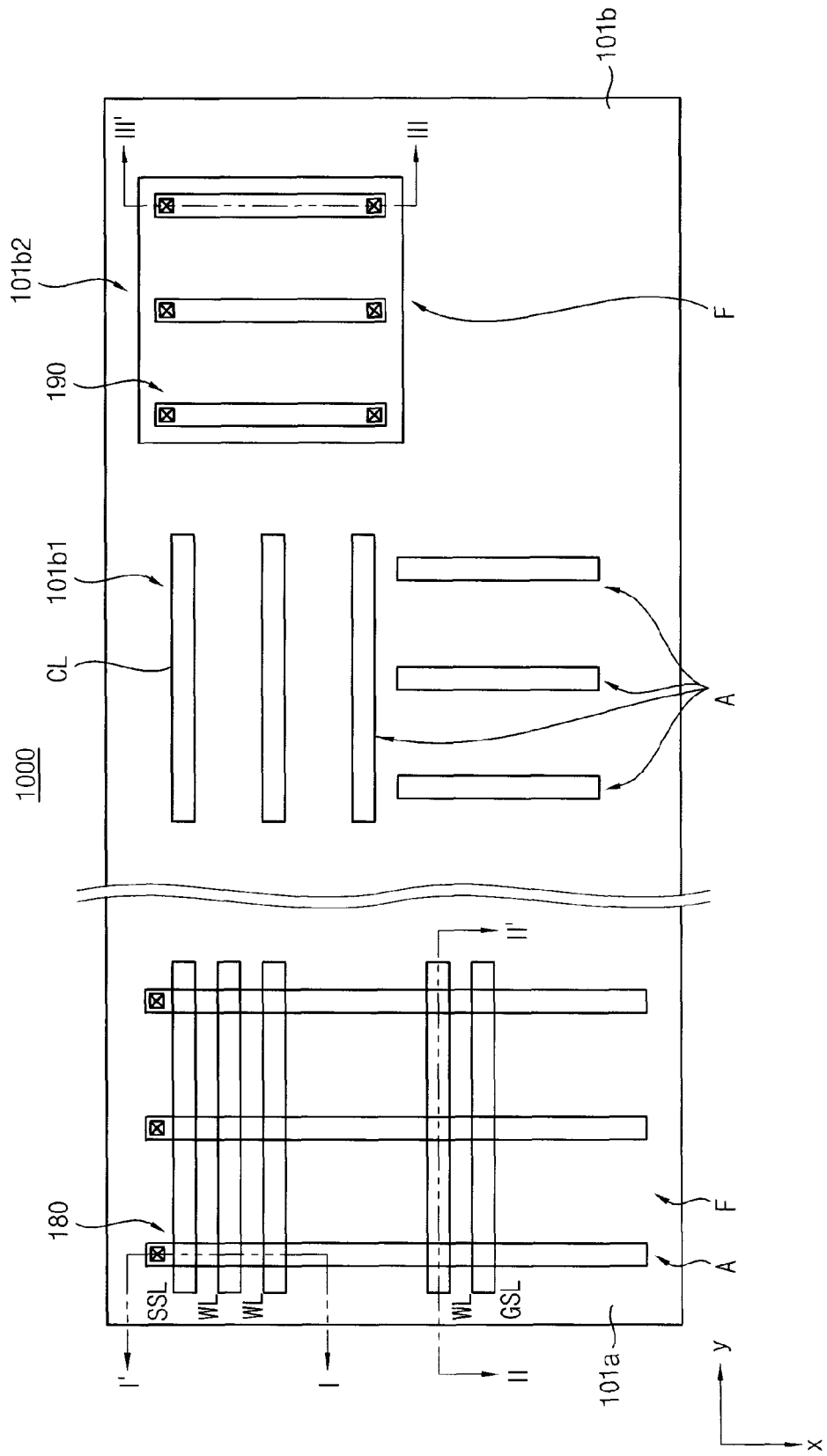

METHOD OF MANUFACTURING AN INTEGRATED CIRCUIT DEVICE

CROSS-REFERENCE TO RELATED APPLICATIONS

This application claims the benefit of priority under 35 U.S.C. §119 from Korean Patent Application No. 10-2011-0002546 filed on Jan. 11, 2011, in the Korean Intellectual Property Office, the disclosure of which is incorporated herein in its entirety by reference.

BACKGROUND OF THE INVENTION

1. Field of the Invention

Example embodiments relate to an integrated circuit device and a method of manufacturing the same, and more particularly, to an integrated circuit device including a resistor and a method of manufacturing the same.

2. Description of the Related Art

As the semiconductor industry has made rapid progress, integrated circuit devices have been utilized for many electronic instruments in various industrial fields. The integrated circuit device generally includes a great number of transistors, diodes, capacitors and resistors that are highly integrated therein, and thus an overall resistance of the integrated circuit device needs to be variable in accordance with requirements of the electronic instruments including the integrated circuit device.

In conventional integrated circuit devices, the resistor has an electric resistance greater than that of wiring structures and thus low-resistive materials for the wiring structure are insufficient for the resistor. In addition, the resistors are generally formed simultaneously with the diodes and the transistors and no additional process is provided just for the resistors in view of process efficiency of the manufacturing process.

For those reasons, the resistor of the integrated circuit devices may be formed on the device isolation layer simultaneously with the gate structure of the transistor. That is, the gate structure may be formed on an active region of a substrate and the transistor may be formed on the device isolation layer simultaneously with the gate structure in the same process. Since electric resistance of polysilicon is easily controlled by doping various impurities, both of the gate structure and the resistor generally include polysilicon.

A doped polysilicon pattern is usually used as the resistor of the integrated circuit device and a conductive connector is connected with the resistor and external wirings. Thus, the connector comprises low-resistive metals so as to reduce contact resistance at a boundary area of the resistor and the connector.

However, when polysilicon of the resistor and the metal of the connector make direct contact with each other, a plurality of voids is generated at the boundary area of the connector and the resistor due to the silicidation process of the polysilicon and the metal. Thus, a contact resistance of the resistor is rapidly increased and the resistor and the wiring tend to be electrically disconnected from each other due to the voids. Since it is widely known that the contact resistance has a critical effect on an overall sheet resistance of the resistor, the variation of the contact resistance caused by the silicidation between the resistor and the connector necessarily leads to the variation of the overall resistance of the resistor.

When programming, erasing or reading data in flash memory devices, a reference voltage is usually applied to a reference cell transistor by a reference cell operator and the reference cell operator conventionally needs the resistor. Thus, the large resistance variation of the resistor necessarily leads to an unstable operation of the reference cell operator, thereby severely deteriorating the reliability of the flash memory device. Recently, the resistance variation of the resistor is tend to increase due to the reduction of critical dimension (CD) of semiconductor chips and thus the operation reliability of the integrated circuit devices is tend to be deteriorated.

Accordingly, there is still a need for an improved resistor for integrated circuit devices in which the variation of the contact resistance and the sheet resistance are minimized and thus the operation reliability of the integrated circuit device is sufficiently improved.

SUMMARY OF THE INVENTION

Example embodiments of the present inventive concept provide an integrated circuit device in which a contact resistance of a resistor is minimized.

Other example embodiments of the present inventive concept provide a method of manufacturing the above integrated circuit device.

Additional aspects and advantages of the present general inventive concept will be set forth in part in the description which follows and, in part, will be obvious from the description, or may be learned by practice of the general inventive concept.

According to some example embodiments, there is provided a method of manufacturing an integrated circuit device. A substrate may be prepared to have an active region defined by a device isolation layer. A resistor pattern may be formed on the device isolation layer. The resistor pattern may include a resistor body positioned in a recess portion of the device isolation layer and at least a connector making contact with the resistor body and positioned on the device isolation layer around the recess portion. The connector may include a metal silicide pattern having electric resistance lower than that of the resistor body at an upper portion thereof. A gate pattern may be formed on the active region of the substrate. The gate pattern may include the metal silicide pattern at an upper portion thereof. A resistor interconnection may be formed to make contact with the connector of the resistor pattern.

A plurality of the gate patterns may be formed on a cell area of the substrate in which a plurality of cell transistors is formed and on a peripheral circuit portion of a peripheral area of the substrate in which a plurality of peripheral transistors electrically connected to the cell transistor is formed, and the resistor pattern is formed on a resistor portion of the peripheral area of the substrate simultaneously with the gate pattern.

The resistor pattern may be exemplarily formed as follows: The device isolation layer may be on a field region of the substrate and a tunnel insulation pattern and a floating gate pattern on the active region of the substrate in such a manner that the device isolation layer and the tunnel insulation pattern and a floating gate pattern are shaped into a line and a sidewall of the floating gate pattern is exposed over the device isolation layer in the cell area and the device isolation layer is formed into a bulk shape in the resistor portion of the peripheral area of the substrate. Then, a dielectric layer and a first conductive layer may be formed on the floating gate pattern and the device isolation layer. The bulk-shaped device isolation layer at the resistor portion of the peripheral area of the substrate may be partially removed while partially exposing the floating gate pattern on the active region of the substrate, thereby forming the recess portion on the bulk-shaped device isolation layer. A second conductive layer may be formed on the cell area and the peripheral area of the substrate along a surface profile thereof. The second conductive layer, the first conductive layer and the dielectric layer may be patterned, thereby forming a preliminary gate pattern on the active region of the substrate and forming a preliminary resistor pattern on the bulk-shaped device isolation layer. The preliminary resistor pattern may include a preliminary resistor body at a bottom of the recess portion and a preliminary connector on the bulk-shaped device isolation pattern around the recess portion thereof. A metal silicide pattern may be formed on the preliminary gate pattern and the preliminary resistor pattern, so that the resistor pattern on the resistor portion of the peripheral area of the substrate may be formed simultaneously with the gate pattern on the active region of the substrate.

The device isolation layer may be formed as follows. The substrate on which the tunnel insulation layer and the floating gate layer are stacked may be etched off by a self-aligned process, thereby forming a trench in the field region of the substrate simultaneously with the tunnel insulation pattern and the floating gate pattern defined by the trench. Then, the trench may be filled up with insulation materials, thereby forming the device isolation layer in the trench. An upper portion of the device isolation layer may be partially removed in the cell area of the substrate, thereby exposing the sidewall of the floating gate pattern over the device isolation layer in the cell area of the substrate.

The bulk-shaped device isolation layer may be removed as follows. A first mask pattern may be formed on the first conducive layer. The first mask pattern may include a plurality of openings through which the first conductive layer is partially exposed on the active region and the resistor portion of the peripheral area of the substrate, respectively. The first conductive layer, the dielectric layer and the bulk-shaped device isolation layer may be partially removed by a first etching process using the first mask pattern as an etching mask at the resistor portion of the peripheral area while simultaneously removing the first conductive layer and the dielectric layer at the active region of the substrate by the first etching process, so that the recess portion may be formed on the bulk-shaped device isolation layer at the resistor portion of the peripheral area and the floating gate pattern may be partially exposed at the active region of the substrate.

The first mask pattern may include a first opening through which the floating gate pattern corresponding to a string selection transistor is exposed in the cell area, a second opening through which the floating gate pattern corresponding to the peripheral transistor is exposed in the peripheral circuit portion of the peripheral area and a third opening through which a central portion of the bulk-shaped device isolation layer is exposed.

The second conductive layer may be formed into a control gate of a stack gate pattern together with the first conducive layer in the cell area while the second conductive layer making contact with the floating gate pattern through the first opening is formed into the string selection transistor and the second conductive layer making contact with the floating gate pattern through the second opening is formed into the peripheral transistor.

The second conductive layer, the first conductive layer and the dielectric layer may be patterned as follows: A second mask pattern may be formed on the second conductive layer. A dry etching process may be sequentially performed against the second conductive layer, the first conductive layer and the dielectric layer using the second mask pattern as an etching mask, thereby forming the preliminary gate pattern and the preliminary resistor pattern.

The metal silicide pattern may be formed as follows. A protection layer may be formed to cover the preliminary gate pattern and the preliminary resistor pattern. The protection layer may be planarized until the preliminary gate pattern and the preliminary resistor pattern are exposed, thereby forming a protection pattern form which a second conductive pattern is protruded. A metal layer may be formed on the protection pattern such that the second conductive pattern is covered with the metal layer. A heat treatment may be performed to the metal layer, thereby forming the metal silicide layer on the second conductive pattern.

Before forming the protection layer, spacers may be further formed on sidewalls of the preliminary gate pattern and the preliminary resistor pattern. An etch stop layer may be further formed on the preliminary gate pattern, the preliminary resistor pattern, the tunnel insulation layer and the etch stop layer.

The protection layer may include tetra ethyl ortho silicate deposited by plasma enhanced chemical vapor deposition process (PETEOS). The protection layer may be planarized by one of a chemical mechanical polishing (CMP) process, a chemically enhanced polishing (CEP) process and an etch-back process.

The metal layer may include at least a material selected from the group consisting of tungsten (W), nickel (Ni), cobalt (Co), titanium (Ti), tantalum (Ta) and combinations thereof.

The resistor interconnection may be formed as follows: An insulation interlayer may be formed on the protection pattern and the metal silicide pattern and the insulation interlayer may be patterned to thereby form an opening through which the metal silicide pattern on the connector is exposed. A first conductive pattern may be formed in the opening such that the first conductive pattern may make contact with the metal silicide pattern of the connector.

A second conductive pattern may be further formed to make contact with the active region of the substrate through the insulation interlayer. The second conductive pattern may be formed simultaneously with the first conductive pattern.

According to some example embodiments, there is provided an integrated circuit device including a resistor pattern having a metal silicide pattern to thereby reduce a contact resistance. The integrated circuit device includes a substrate having an active region defined by a device isolation layer, a resistor pattern formed on the device isolation layer, a gate pattern formed on the active region of the substrate and a resistor interconnection making contact with the connector of the resistor pattern. The resistor pattern may include a resistor body positioned in a recess portion of the device isolation layer and at least a connector making contact with the resistor body and positioned on the device isolation layer around the recess portion. The connector may include a metal silicide pattern having an electric resistance lower than that of the resistor body at an upper portion thereof. The gate pattern may include the metal silicide pattern at an upper portion thereof.

The connector may include a stack structure in which a dielectric pattern, a first conductive pattern, a second conductive pattern and the metal silicide pattern are sequentially stacked and the resistor body includes the second conductive pattern.

The first conductive pattern may include carbon (C)-doped polysilicon and the second conductive pattern includes phosphor (P)-doped polysilicon.

The second conductive pattern may be continuously arranged across the resistor body and the connector and the connector and the resistor body has a stepped portion of about 800 Å to about 1,000 Å.

The gate pattern may include a tunnel insulation layer, a floating gate pattern, the dielectric pattern, the first and the second conductive patterns that are sequentially stacked on the cell area of the substrate.

The resistor pattern for applying a reference voltage to cell transistors may be provided with the bulk device isolation layer in such a configuration that the resistor body is arranged in the recess of the bulk device isolation layer and the connector is arranged around the recess of the bulk device isolation layer, so that the resistor pattern may have a stepped portion between the resistor body and the connector. Particularly, the metal silicide may be arranged at the upper portion of the connector of the resistor pattern. Thus, a contact resistance Rc between the connector and the resistor interconnection may be sufficiently reduced without any deterioration of a sheet resistance Rs of the resistor body. Accordingly, the electrical resistance of the resistor pattern may be reduced and become stable, and thus the reference voltage may be applied to the cell transistors with high reliability.

The foregoing and/or other aspects and utilities of the present general inventive concept may also be achieved by providing a method of manufacturing an integrated circuit device, the method including forming one or more device isolation layers on a cell area and a peripheral area of a substrate, forming a resistor pattern having a resistor body having a first electric resistance and a connector having a second electric resistance lower than the first electric resistance, on the device isolation layers of a resistor portion of the peripheral area of the substrate, and forming a resistor interconnection to contact the connector of the resistor pattern to reduce a contact resistance therebetween.

The method may further include forming one or more gate patterns on active regions of the cell area of the substrate, and the forming of the device isolation layers in the cell area may include forming the device isolation layers in field regions of the cell area between the adjacent active regions.

The forming of the gate patterns may include forming a floating gate pattern of the gate pattern to be disposed between the device isolation layer such that an upper portion of the floating gate pattern of the gate pattern is exposed from an upper portion of one or more the device isolation layers.

The forming of the one or more device isolation layers on the peripheral layer of the substrate may include forming a recess portion and a protrusion portion in the respective device isolation layers, forming the resistor body on the recess portion and the protrusion portion; and forming the connector on the protrusion portion to have a depth of recess with the resistor body in the recess portion.

The foregoing and/or other aspects and utilities of the present general inventive concept may also be achieved by providing an integrated circuit device including one or more device isolation layers formed on a cell area and a peripheral area of a substrate, a resistor pattern having a resistor body having a first electric resistance and a connector having a second electric resistance lower than the first electric resistance, formed on the device isolation layers of a resistor portion of the peripheral area of the substrate, and a resistor interconnection formed to contact the connector of the resistor pattern to reduce a contact resistance therebetween.

One or more gate patterns may be formed on active regions of the cell area of the substrate, and the device isolation layers are formed in field regions of the cell area between the adjacent active regions.

A floating gate pattern of the gate pattern may be formed to be disposed between the device isolation layers such that an upper portion of the floating gate pattern of the gate pattern is exposed from an upper portion of one or more the device isolation layers.

A recess portion and a protrusion portion may be formed in the respective device isolation layers such that the resistor body is on the recess portion and the protrusion portion, and the connector is formed on the protrusion portion to have a depth of recess with the resistor body in the recess portion.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a plan view illustrating an integrated circuit device in accordance with an example embodiment of the present inventive concept;

DETAILED DESCRIPTION OF THE PREFERRED EMBODIMENTS

Figure 2A:
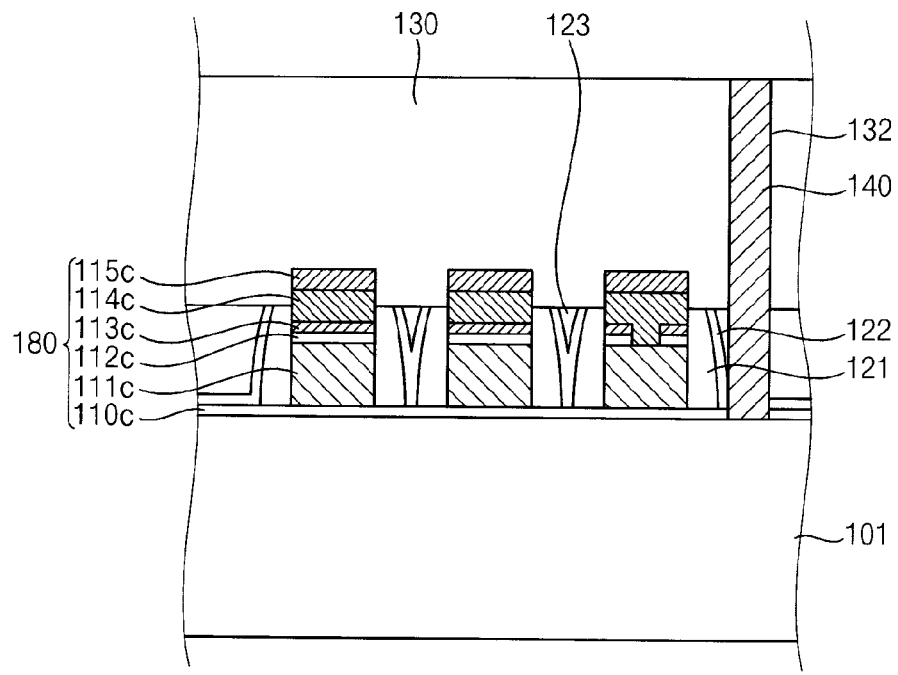
FIG. 2A is a cross-sectional view along a line I-I' of FIG. 1.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of an integrated circuit device will be explained in detail with reference to the accompanying drawings.

Figure 2B:
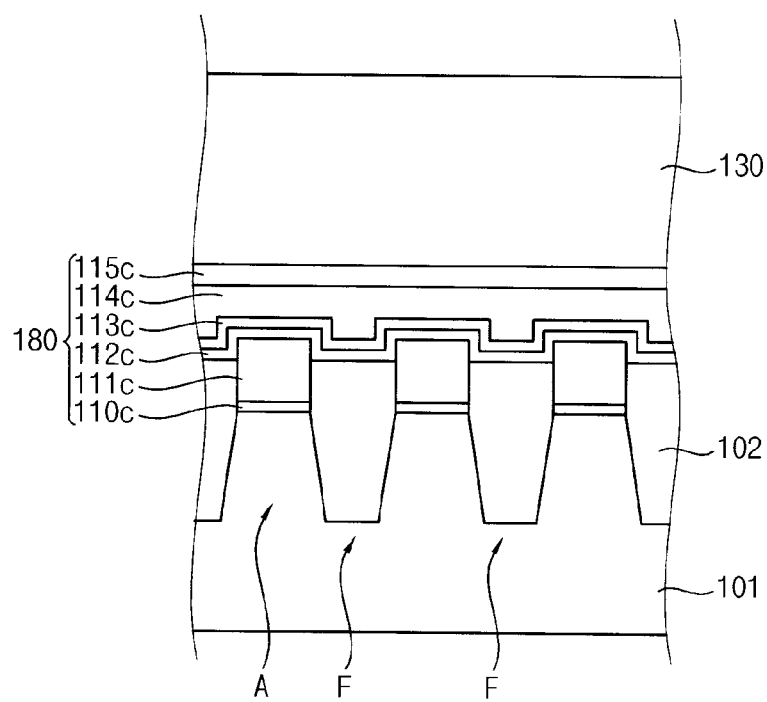
FIG. 2B is a cross-sectional view along a line II-II' of FIG. 1.
Figure 2C:
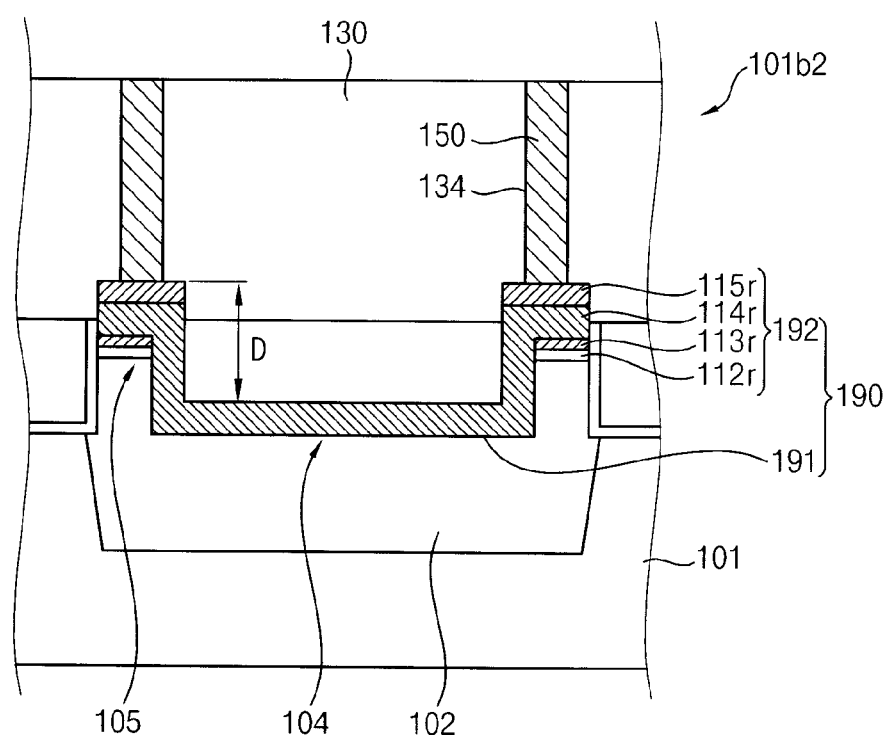
FIG. 2C is a cross-sectional view along a line III-III' of FIG. 1.

FIG. 1 is a plan view illustrating an integrated circuit device in accordance with an example embodiment of the present inventive concept. FIG. 2A is a cross-sectional view along a line I-I' of FIG. 1 and FIG. 2B is a cross-sectional view along a line II-II' of FIG. 1. FIG. 2C is a cross-sectional view along a line III-III' of FIG. 1. Hereinafter, an integrated circuit device including one or more flash memory devices will be disclosed as an illustrative of example embodiments of the present inventive concept but is not to be construed as limiting thereof. Thus, the present inventive concept is also applicable to other integrated circuit devices including various semiconductor devices.

Referring to FIGS. 1 and 2A to 2C, the integrated circuit device 1000 in accordance with an example embodiment of the present inventive concept may include a gate pattern 180 and a resist pattern 190 formed on a substrate 101. The substrate 101 may include an active region A defined by a device isolation layer 102 disposed in a field region, and the gate pattern 180 may be positioned on the active region A of the substrate 101 and the resistor pattern 190 may be positioned on the device isolation layer 102. The resistor pattern 190 may include a resistor body 191 and a connector 192. The resistor body 191 may have a stepped portion. A metal silicide pattern 115c may be arranged on upper portions of the gate pattern 180 and the connector 192 of the resistor pattern 190.

The substrate 101 may include a semiconductor substrate such as a wafer and divided into the active region A on which conductive structures, such as transistors, may be arranged and the field region F on which the device isolation layer may be arranged.

A plurality of cell transistors may be arranged in a cell area 101a of the substrate 101 in a matrix shape. A data operation, such as the programming, an erasing operation, and a reading operation may be performed in the cell transistors. A plurality of peripheral transistors may be arranged in a peripheral area 101b of the substrate 101. For example, the peripheral transistors may be provided in a driving circuit to drive the cell transistors and a ground circuit to provide potential of an electrical ground to the cell transistors. The peripheral area 101b of the substrate 101 may include a peripheral circuit portion 101b1 in which the peripheral transistors may be arranged and a resistor portion 101b2 in which the resistor pattern 190 may be arranged. The resistor pattern 190 may be connected to the driving circuit and thus control a reference voltage to be applied to the cell transistors.

In the present example embodiment, the active region A may have a shape, for example, a line shape extending in a first direction x in the cell area 101a of the substrate 101. A plurality of the gate patterns 180 for a cell transistor may be arranged in the active region A along the first direction x and be spaced apart from each other by a cell gap distance. A pair of source and drain electrodes (not illustrated) may be arranged at both sides of each gate pattern. Each of the gate patterns may also be connected in series along a second direction y substantially perpendicular to the first direction x to thereby form a plurality of lines extending in the second direction y. The lines may function as string selection lines (SSLs), word lines (WLs) and ground selection lines (GSLs) for a flash memory device.

A plurality of the peripheral transistors may be arranged in the peripheral area 101b of the substrate 101. The peripheral transistors may be electrically connected to a line to thereby form a peripheral conductive line CL that may be at least one of the SSLs, WLs and GSLs. Thus, the peripheral conductive line CL may include a gate line to transfer data signals to the word line WL. The peripheral transistors may be spaced apart from one another by a peripheral gap distance greater than the cell gap distance of the cell transistors, and the peripheral conductive line CL may extend in any directions according to device and process requirements.

A device isolation layer 102 may be a bulk type device isolation layer to be provided in the resistor area 101b2 of the peripheral area 101b. A recess, such as a line-shaped recess, may be provided with the device isolation layer 102 as illustrated in FIG. 2C. The resistor pattern 190 may be positioned on the device isolation layer 102 along a surface profile of the line-shaped recess. The resistor pattern 190 may include the resistor body 191 positioned on a bottom and a sidewall of the recess and the connector 192 positioned on both end portions of the resistor body 191. External wirings may make contact with the connector 192 and thus external signals may be applied from an external device to the resistor pattern 190 though the external wirings and the connector 192.

The gate pattern 180 may include a stack gate pattern in which a tunnel insulation pattern 110c, a floating gate pattern 111c, a dielectric pattern 112c, a control gate pattern having a first and a second conductive pattern 113c and 114c and a metal silicide pattern 115c may be sequentially stacked on the active region A of the substrate 101. Particularly, the transistors for the SSL may not include the dialectic pattern 112c and the first conductive pattern 114c. Thus, the floating gate pattern 111c and the second conductive pattern 114c may make direct contact with each other in the transistor for the SSL.

The tunnel insulation pattern 110c and the floating gate pattern 111c may be shaped into a line extending in the first direction x, and the dielectric pattern 112c, the first conductive pattern 113c and the second conductive pattern 114c may be shaped into a line extending in the second direction y.

The device isolation layer 102 may include an insulation layer filled into a trench (not illustrated) around the active region A and thus the active region A of the substrate 101 may be isolated from one another by the device isolation layer 102. An upper portion of the isolation layer may be removed in such a way that a sidewall of the floating gate pattern 111c may be exposed to a field region F of the substrate 101 as illustrated in FIG. 2B. The device isolation layer 102 disposed in the cell area 101a may also be shaped into a line extending in the first direction x in parallel with the active region A in such a configuration that the line-shaped active region A and the line-shaped device isolation layer 102 may be arranged alternately with each other along the second direction y.

The device isolation layer 102 of the peripheral area 101b may be shaped into various shapes according to the device and process requirements of the integrated circuit device 1000. For example, a line-shaped device isolation layer may be positioned at the peripheral circuit portion 101b1 of the peripheral area 101b and thus the peripheral conductive lines CL may be electrically isolated from one another by the line-shaped device isolation layer. The device isolation layer 102, such as a bulk-type device isolation, layer may be positioned at the resistor portion 101b2 of the peripheral area 101b and thus the resistor pattern 190 may be positioned on the bulk-type device isolation layer.

For example, the resistor pattern 190 of the resistor portion 101b2 of the substrate 101 may be shaped into a line extending in the first direction x and may have a stepped portion between the resistor body 191 and the connector 192 due to the recess of the bulk device isolation layer 102.

A plurality of the line-shaped recesses may be provided on an upper surface of the bulk-type device isolation layer along the first direction x and each of the recesses may have a depth D from the upper surface of the bulk-type device isolation layer. Thus, the bulk-type device isolation layer may include a recess portion 104 and a protrusion portion 105 around the recess portion 104. The resistor body 191 of the resistor pattern 190 may be positioned in the recess portion 104 and the connector 192 of the resistor pattern 190 may be positioned on the protrusion portion 105 of the bulk-type device isolation layer.

The dielectric pattern 112r, the first conductive pattern 113r, the second conductive pattern 114r and the metal silicide pattern 115r may be sequentially stacked on the protrusion portion 105 of the bulk-type device isolation layer, and thus the connector 192 of the resistor pattern 190 may be positioned on the protrusion portion 105 of the bulk-type device isolation layer. It is possible that the second conductive pattern 114r may be arranged on the recess portion 104 of the bulk-type device isolation layer and thus the resistor body 191 of the resistor pattern 190 may be positioned in the recess portion 104 of the bulk-type device isolation layer. The second conductive pattern 114r may be shaped into a line in such a configuration that the second conductive pattern 114r may cover an upper surface of the protrusion portion 105 and bottom and sidewalls of the recess portion 104 of the bulk-type device isolation layer. That is, the second conductive pattern 114r may be arranged on an upper surface of the bulk-type device isolation layer along a surface profile of the recess and thus the protrusion portion 105 may be covered with the second conductive pattern 114r and the recess may be partially filled with the second conductive pattern 114r.

The same dielectric pattern 112, the first conductive pattern 113, the second conductive pattern 114 and the metal silicide pattern 115 may be arranged in the cell area 101a and the peripheral area 101b of the substrate 101. Thus, the same patterns 112 to 115 on the cell area 101a and the resistor portion 101b2 of the peripheral area 101b may be referred to as 112c to 115c and 112r to 115r, respectively, according to the positions at which the patterns 112 to 115 may be arranged on the substrate 101. For example, the dielectric pattern 112c refers to the dielectric pattern that is arranged in the cell area 101a and the dielectric pattern 112r refers to the dielectric pattern that is arranged on the bulk-type device isolation layer 102 of the peripheral area 101b of the substrate 101.

A spacer 121 may be positioned on a sidewall of the gate pattern 180 and the tunnel insulation pattern 110 and the spacer 121 may be exposed to a gap space between a pair of neighboring gate patterns 180. An etch stop layer 122 may be positioned on the spacer 121 and the tunnel insulation pattern 110 in the gap space. A protection pattern 123 may be positioned in the gap space in such a configuration that an upper sidewall of the gate pattern 180 may not be covered with the protection pattern 123. Since the protection pattern 123 may also be arranged across the cell area 101a and the peripheral area 101b of the substrate 101, and the second conductive pattern 114r may also be uncovered with the protection pattern 123 at the protrusion portion 105 of the bulk device isolation layer 102, while the second conductive pattern 114r in the recess portion 104 may be fully covered with the protection pattern 123. That is, the second conductive pattern 114r of the resistor body 191 may be sufficiently covered with the protection pattern 123 and the second conductive pattern 114r of the connector 192 may be exposed from the protection pattern 123.

In the present example embodiment, the recess may have the depth D of about 350 Å to about 550 Å. In such a case, the second conductive pattern 114r may have the stepped portion of about 800 Å to about 1,000 Å between the recess portion 104 and the protrusion portion 105 of the bulk device isolation layer 102 since the dielectric pattern 112r and the first conductive pattern 113r may be further positioned under the second conductive pattern 114r at the protrusion portion 105 of the bulk device isolation layer 102.

The metal silicide pattern 115c of the cell area 101a may be positioned on the second conductive pattern 114c of the gate pattern 180 and the metal silicide pattern 115r of the resistor portion of the peripheral area 101b may be positioned on the second conductive pattern 114r that may protrude from the protection pattern 123. Thus, the metal silicide pattern 115r may be arranged at an upper portion of the connector 192 of the resistor pattern 190. The metal silicide pattern 115r may be positioned at the upper portion of the connector 192 without any electrical effect on the resistor body 191. Thus, a contact resistance Rc of the connector 192 may be sufficiently reduced without any deterioration of a sheet resistance of the resistor pattern 190, thereby sufficiently minimizing a resistance variation of the resistor pattern 190 caused by the increase and non-uniformity of the contact resistance Rc of the connector 192.

An insulation interlayer 130 may be positioned on the protection pattern 123 and the metal silicide pattern 115 across the cell area 101a and the peripheral area 101b of the substrate 101. The insulation interlayer 130 may include a plurality of openings (not shown) through which the active regions A may be partially exposed in the cell area 101a and the connector 192 of the resistor pattern 190 may be exposed in the resistor portion 101b2 of the peripheral area 101b. Underlying structures such as the gate pattern 180 and the connector 192 of the resistor pattern 190 may be electrically insulated from upper structures such as wiring structures.

A wiring interconnection 140 and a resistor interconnection 150 may be positioned in openings of the insulation interlayer 130, for example, a first hole 132 and a second hole 134, respectively. The wiring interconnection 140 may be electrically connected to the active region A of the substrate 101 and the resistor interconnection 150 may be electrically connected to the connector 192 of the resistor pattern 190. For example, the wiring interconnection 140 may include a bit line contact to make contact with the active region A of the substrate 101 disposed adjacent to the SSL of the flash memory device. In the present example embodiment, the wiring interconnection 140 and the resistor interconnection 150 may have substantially the same materials and may be formed by the same process.

For example, the first conductive pattern 113 may comprise carbon-doped (C-doped) polysilicon and the second conductive pattern 114 may comprise phosphor-doped (P-doped) polysilicon. Thus, the underlying conductive structures may be sufficiently prevented from damage in a heat treatment for forming the metal silicide pattern 115 by the C-doped polysilicon pattern and the P-doped polysilicon pattern. In addition, the assembly of the C-doped polysilicon pattern and the P-doped polysilicon pattern may also prevent the diffusion of the metal silicide to the underlying structures.

The wiring interconnection 140 and the resistor interconnection 150 may include low-resistive metals and the metal silicide pattern 115 may comprise silicide materials of the metal in the wiring interconnection 140 and the resistor interconnection 150. For example, the wiring interconnection 140 and the resistor interconnection 150 may comprise cobalt (Co) or nickel (Ni), the metal silicide pattern 115 may comprise cobalt silicide or nickel silicide.

Although not shown in figures, various wiring structures (not illustrated) may be arranged on the insulation interlayer 130 in such a configuration that the wiring interconnection 140 and the resistor interconnection 150 may make contact with the wiring structures. A passivation layer (not illustrated) may be further arranged on the insulation interlayer 130 to cover the wiring structures and insulating the wiring structures from surroundings, thereby completing the integrated circuit device 1000.

According to an example embodiment of the integrated circuit device, the resistor pattern for applying a reference voltage to cell transistors may be provided with the bulk-type device isolation layer in such a configuration that the resistor body is arranged in the recess of the bulk-type device isolation layer and the connector is arranged around the recess of the bulk-type device isolation layer, so that the resistor pattern may have a stepped portion between the resistor body and the connector. It is possible that the metal silicide may be arranged at the upper portion of the connector of the resistor pattern. Thus, a contact resistance Rc between the connector and the resistor interconnection may be sufficiently reduced without any deterioration of a sheet resistance Rs of the resistor body. Accordingly, an electrical resistance of the resistor pattern may be reduced and become stable, and thus a reference voltage may be applied to the cell transistors with high reliability.

Hereinafter, a method of manufacturing the integrated circuit device of FIG. 1 will be described in detail with reference to FIGS. 3A to 12C.

Figure 3A:
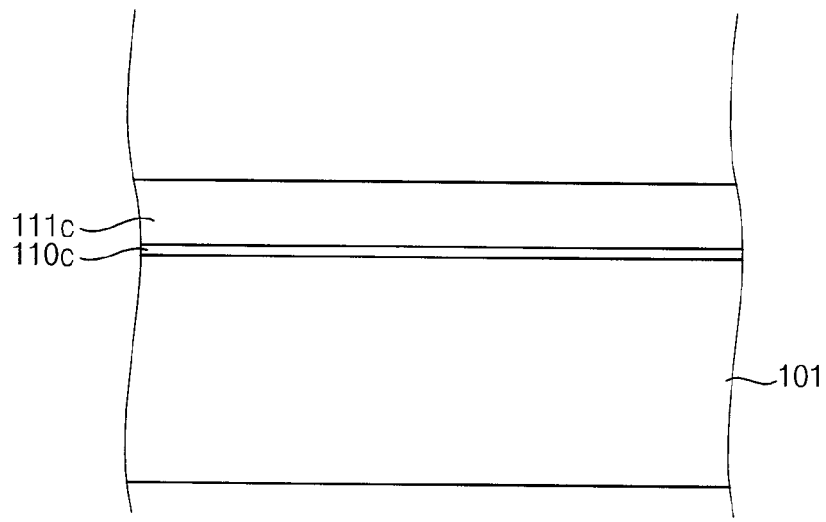
FIGS. 3A to 12C are cross-sectional view illustrating a method of manufacturing the integrated circuit device of FIG. 1.
Figure 3B:
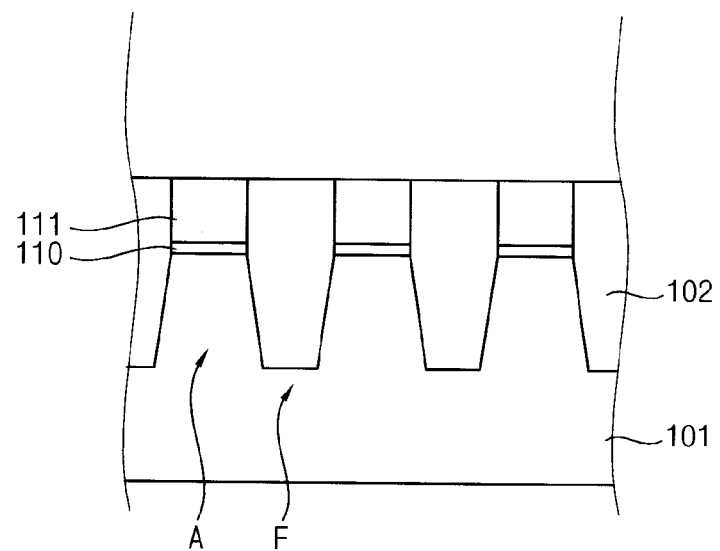
Figure 3C:
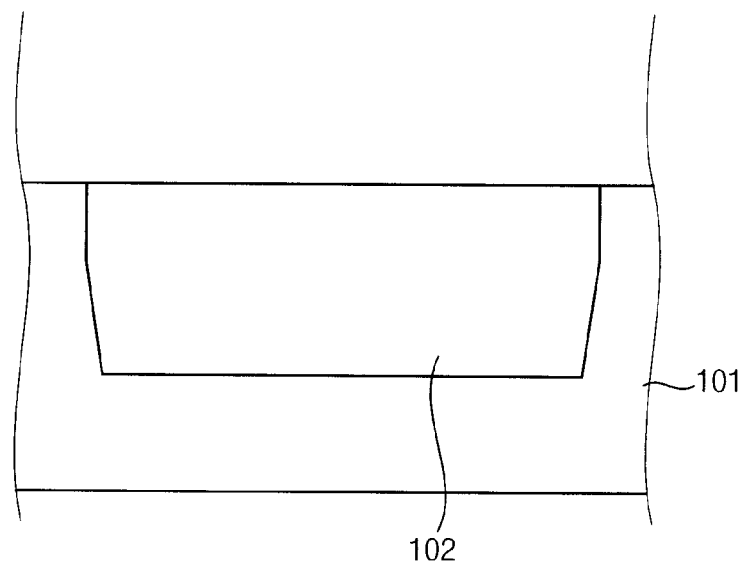
Figure 4A:
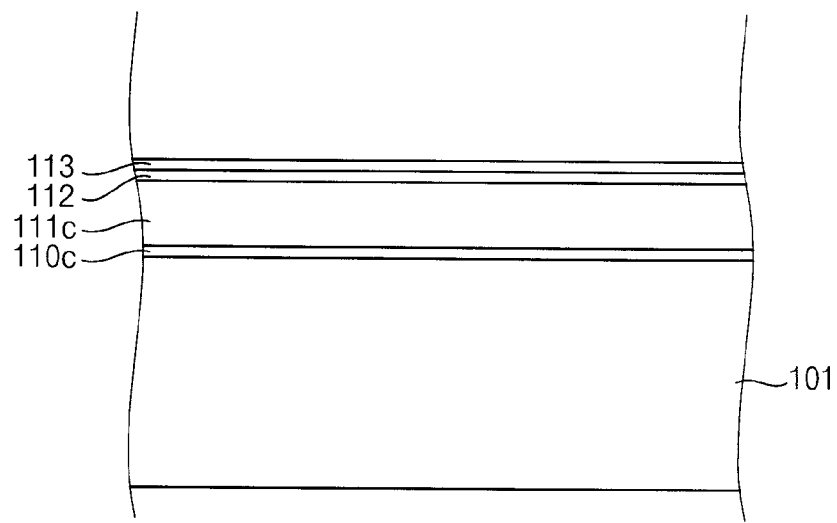
Figure 4B:
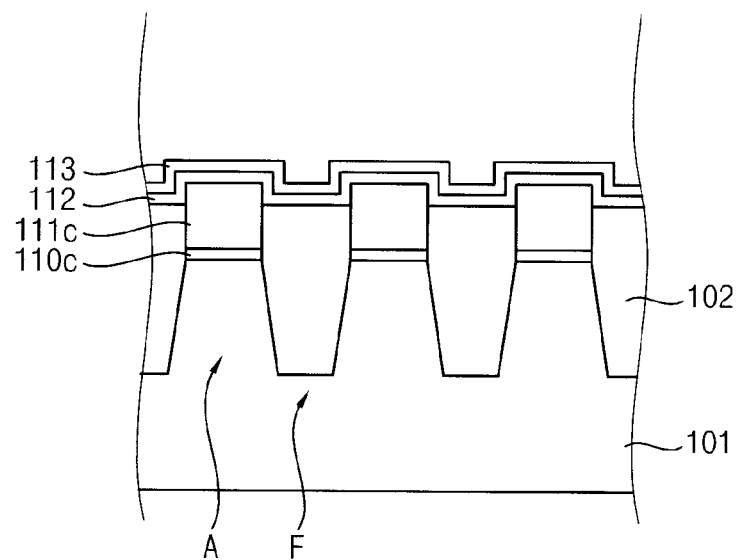
Figure 4C:
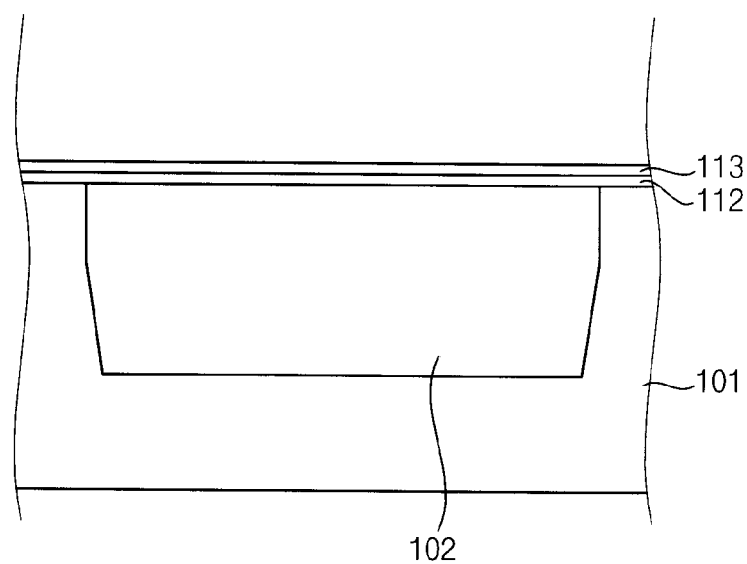
Figure 5A:
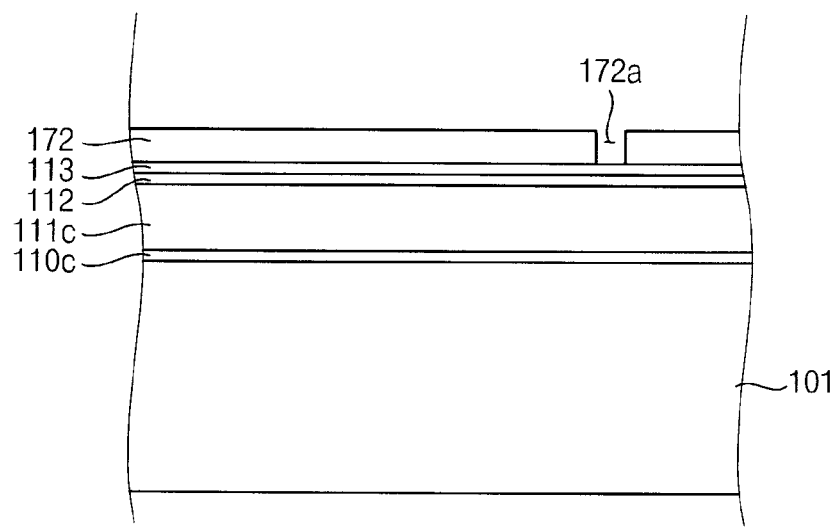
Figure 5B:
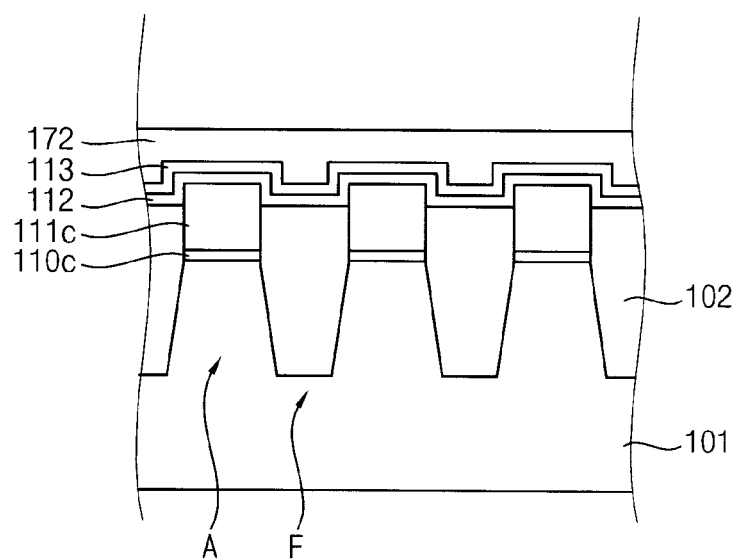
Figure 5C:
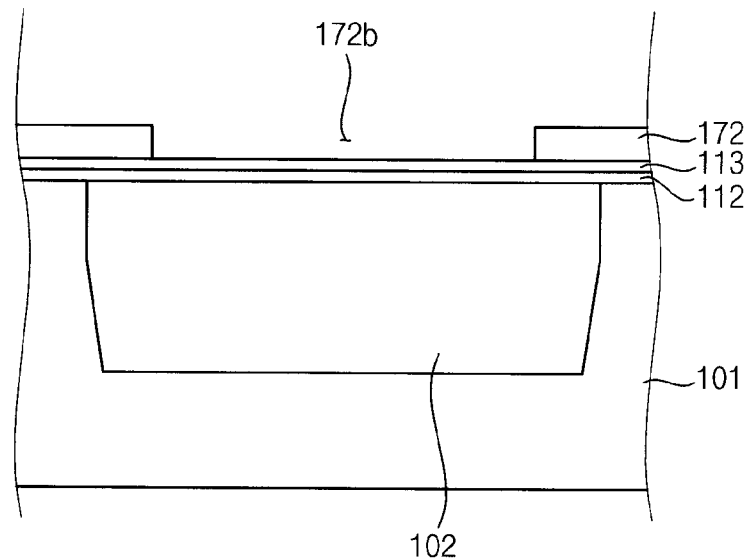
Figure 6A:
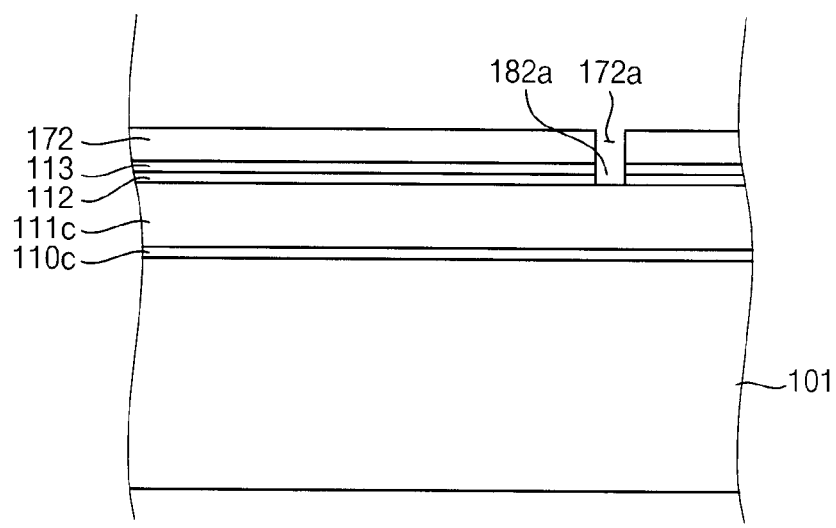
Figure 6B:
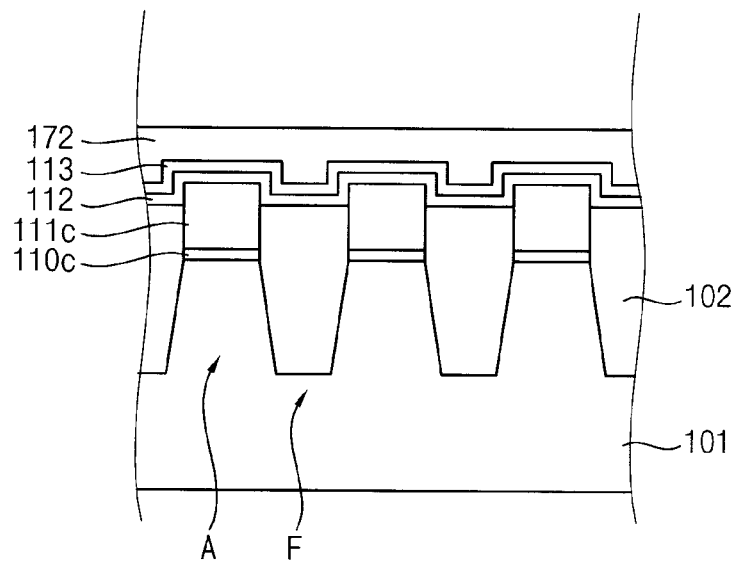
Figure 6C:
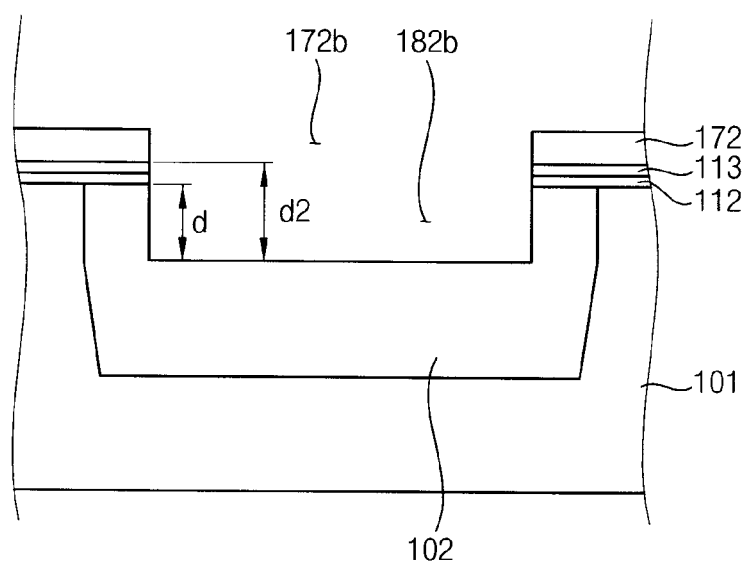
Figure 7A:
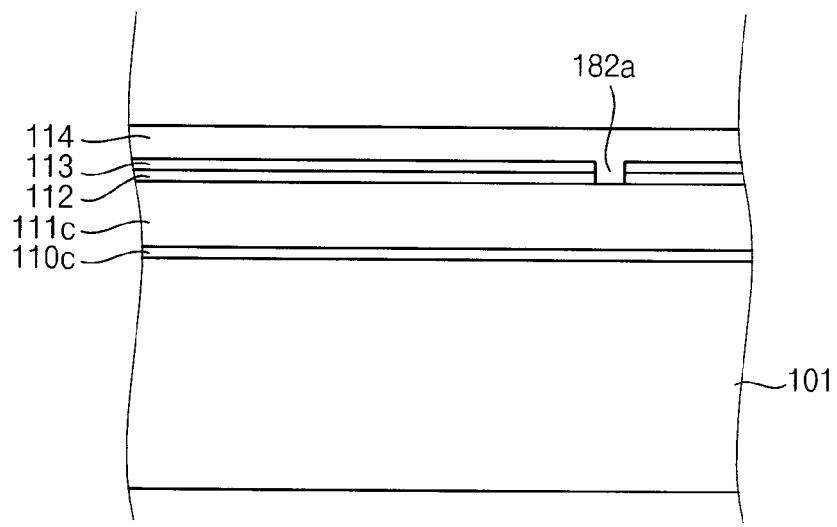
Figure 7B:
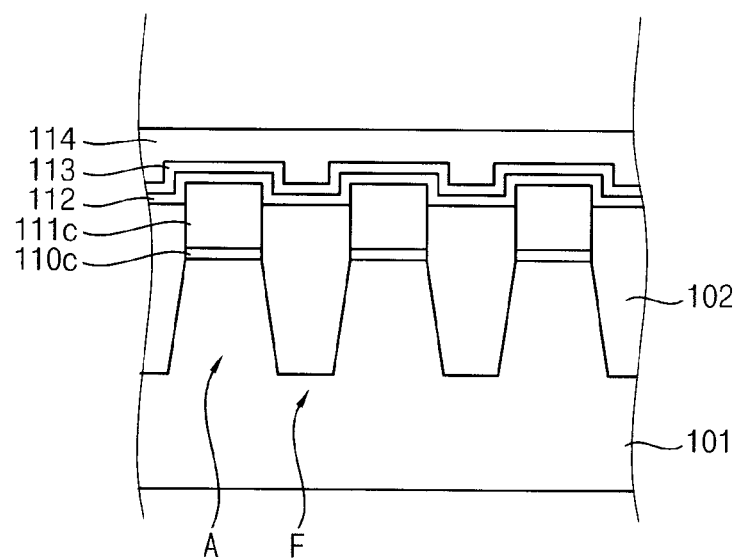
Figure 7C:
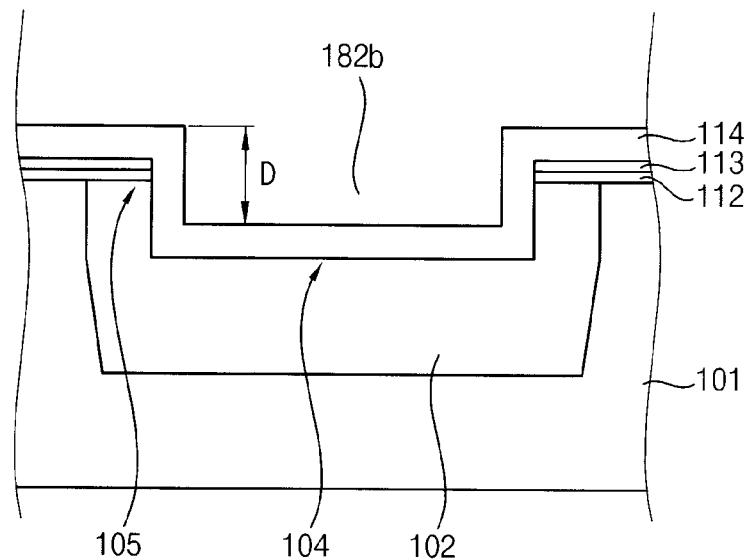
Figure 8A:
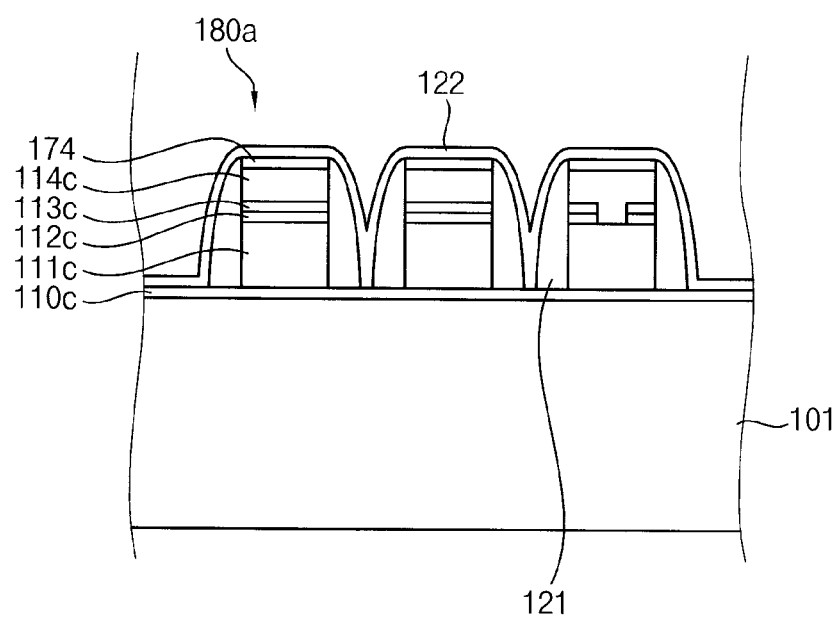
Figure 8B:
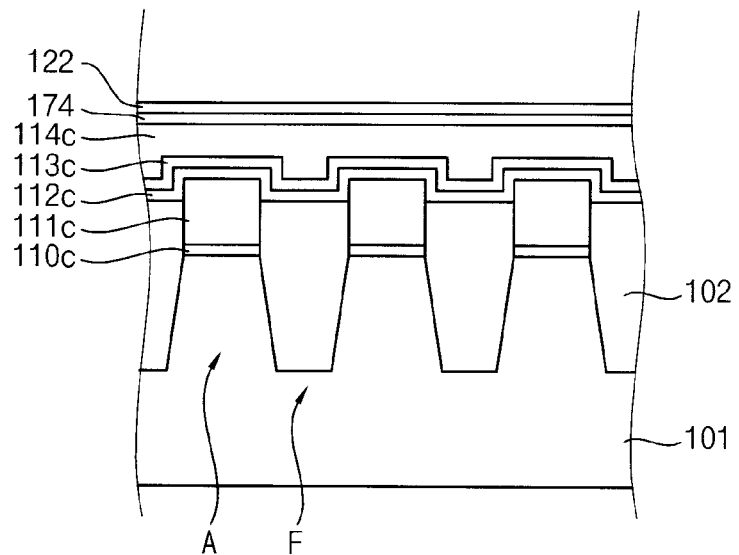
Figure 8C:
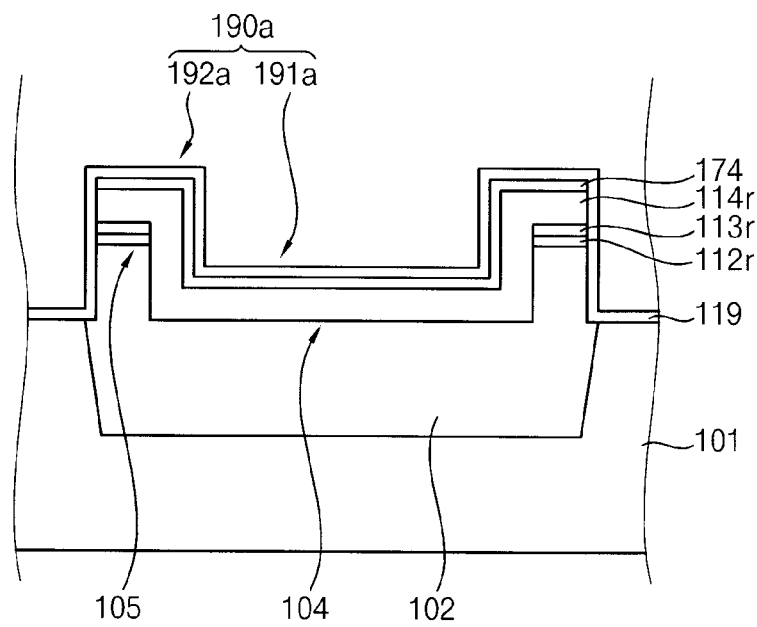
Figure 9A:
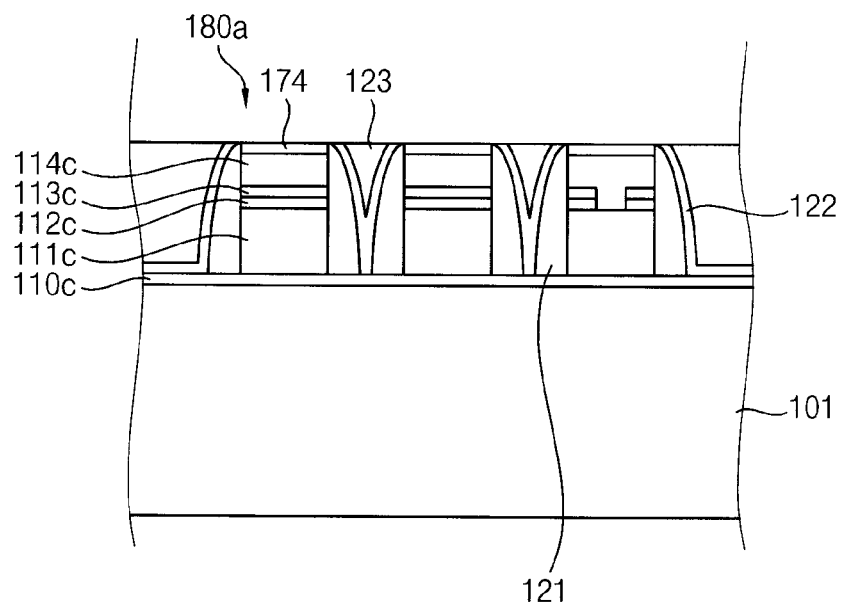
Figure 9B:
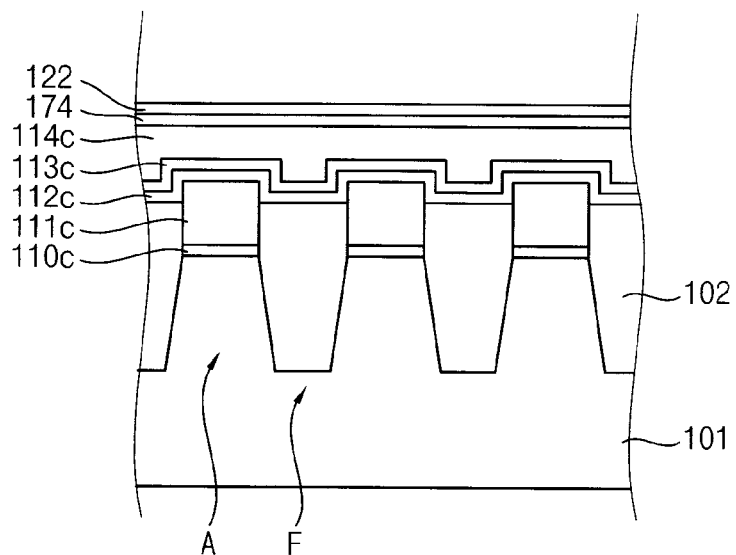
Figure 9C:
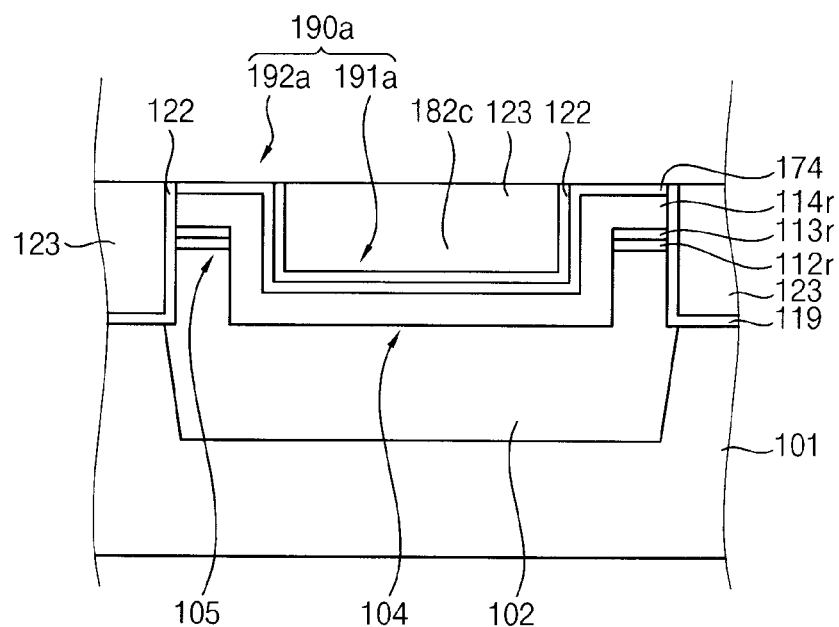

FIGS. 3A to 12C are cross-sectional view illustrating a method of manufacturing the integrated circuit device of FIG. 1. FIGS. 3A, 4A, . . . and 12A correspond to the cross-sectional view along a line I-I' of FIG. 1. FIGS. 3B, 4B, . . . and 12B correspond to the cross-sectional view along a line II-II' of FIG. 1. FIGS. 3C, 4C, . . . and 12C correspond to the cross-sectional view along a line III-III' of FIG. 1. In FIG. 3A to 12C, the same reference numerals will be used to refer to the same or like parts as those shown in FIG. 1.

Referring to FIGS. 1 and 3A to 3C, the device isolation layer 102 may be formed on the field region F, and the tunnel insulation pattern 110 and the floating gate pattern 111 may be formed on the active region A of the substrate 101 defined by the device isolation layer 102.

The substrate 101 may include a semiconductor substrate, such as a wafer, and a plurality of conductive structures may be arranged on the active region A of the substrate 101 and the conductive structures disposed adjacent to each other may be electrically insulated from each other by the device isolation layer 102. A plurality of the cell transistors may be formed into a matrix shape in the cell area 101a of the substrate 101, and a plurality of the peripheral transistors for a driving circuit and a grounding circuit may be arranged in the peripheral area 101b of the substrate 101. The driving circuit may generate an electric power to drive the cell transistors and the grounding circuit may provide a potential to electrically ground the cell transistors, for example. The peripheral area 101b of the substrate 101 may include the peripheral circuit portion 101b1 in which the peripheral transistors may be arranged and the resistor portion 101b2 in which the resistor pattern 190 may be positioned. The resistor pattern 190 may be connected to the driving circuit and control the reference voltage applied to the cell transistors.

A tunnel insulation layer (not illustrated) and a floating gate layer (not illustrated) may be sequentially formed on the substrate 101. A mask pattern (not illustrated) may be formed on the floating gate layer, and then the floating gate layer, the tunnel insulation layer and the substrate 101 may be sequentially etched off by an etching process using the mask pattern, thereby forming the tunnel insulation pattern 110c and the floating gate pattern 111c on the active region A and a trench at the field region F of the substrate 101. The trench may be formed into a line in the cell area 101a and the peripheral area 101b of the substrate 101 or into a bulk recess at the resistor portion 101b2 of the peripheral area 101b.

A preliminary device isolation layer (not illustrated) may be formed on the substrate 101 to a sufficient thickness to fill up the trenches of the substrate 101 and gap spaces between the neighboring tunnel insulation patterns and floating gate patterns. Then, an upper portion of the preliminary device isolation layer may be planarized until an upper surface of the floating gate layer may be exposed. Therefore, the preliminary device isolation layer may remain in the gap space and the trench, thereby forming the device isolation layer 102 extending in the first direction in parallel with the tunnel insulation pattern 110c and the floating gate pattern 111c. The floating gate pattern 111c and the device isolation layer 102 may be formed on the substrate 101 simultaneously with each other by a self-aligned process, and thus the device isolation layer 102 may be coplanar with the floating gate pattern 111c.

For example, the tunnel insulation pattern 110c may include thermal oxide and the floating gate pattern 111c may include first conductive materials. Examples of the first conductive materials may include doped polysilicon, metal, metal silicide, metal oxide silicide, metal nitride silicide, etc. These may be used alone or in combinations thereof. The device isolation layer 102 may include one of undoped silicate glass (USG) and oxide deposited through a high density plasma CVD (HDPCVD) process.

While the present example embodiment discloses that the device isolation layer and the floating gate pattern and the tunnel insulation pattern may be simultaneously formed by the self-alignment process, the device isolation layer 102 and the floating gate pattern and the tunnel insulation pattern may be formed individually or separately from one another by respective processes. For example, the device isolation layer 102 may be formed in the line-shaped trench at the field region F of the substrate 101 and then the tunnel insulation pattern 110c and the floating gate pattern 111c may be formed on the active region A of the substrate 101 that may be exposed between the line-shaped device isolation layer 102.

Although not illustrated in figures, the tunnel insulation pattern and the floating gate pattern may also be formed on the active region A of the peripheral area 101b as well as the cell area 101a of the substrate 101. While the device isolation layer 102 may be formed into a line extending along the first direction x in the cell area 101a, various shapes may be allowable to the device isolation layer 102 in the peripheral area 101b of the substrate 101. For example, the device isolation layer 102 around the peripheral circuit portion 101b1 may be formed into a line and the device isolation layer 102 around the resistor portion 101b2 may be formed into a single bulk recess.

Referring to FIGS. 1 and 4A to 4C, an inter-gate dielectric layer 112 and a first conductive layer 113 may be formed on the floating gate pattern 111c along a surface profile of the floating gate pattern 111c of which sidewalls may be partially exposed.

For example, a cell mask pattern (not illustrated) may be formed on the floating gate pattern 111c and the device isolation layer 102 in such a manner that the peripheral area 101b may be covered with the cell mask pattern and the ell area 101a may be exposed through the cell mask pattern. Then, the device isolation layer 102 of the cell area 101a may be partially removed by an etching process using the cell mask pattern as an etching mask, and thus an upper surface of the device isolation layer 102 may be lower than an upper surface of the floating gate pattern 111c and an upper sidewall of the floating gate pattern 111c may be exposed. Thus, the inter-gate dielectric layer 112 may make contact with the floating gate pattern 111c on a larger surface thereof, thereby increasing the dielectric constant of the inter-gate dielectric pattern 112c.

Since the device isolation layer 102 at the resistor portion 101b2 of the peripheral area 101b may not be removed from the substrate 101, the upper surface of the device isolation layer 102 may be higher in the peripheral area 101b2 than in the cell area 101a of the substrate 101.

For example, when the floating gate pattern 111c may include polysilicon and the device isolation layer 102 may include oxide, the device isolation layer 102 in the cell area 101a may be removed by a wet etching process using an aqueous hydrogen fluoride (HF) solution as an etchant. The aqueous hydrogen fluoride (HF) solution may have a sufficient etching selectivity with respect to the polysilicon and the oxide.

Then, the cell mask pattern may be removed from the floating gate pattern 111c and the inter-gate dielectric layer 112 and the first conductive layer 113 may be sequentially formed on the floating gate pattern 111c and the reduced device isolation layer 102.

The inter-gate dielectric layer 112 may have a dielectric constant higher than that of the tunnel insulation pattern 110c. For example, the inter-gate dielectric layer 112 may include a multilayered oxide/nitride/oxide (ONO) layer in which a first oxide layer, a nitride layer and a second oxide layer may be stacked and a high-k dielectric layer comprising high-k materials. Examples of the high-k materials may include aluminum oxide, hafnium oxide, hafnium aluminum oxide, zirconium oxide, etc. These may be used alone or in combinations thereof. The first conductive layer 113 may comprise carbon-doped polysilicon (C-doped polysilicon).

Referring to FIGS. 1 and 5A to 5C, a first mask pattern 172 may be formed on the first conductive layer 113. The first mask pattern 172 may have a first opening 172a through which the first conductive layer 113 corresponding to the SSL may be partially exposed, a second opening 172b through which the first conductive layer 113 at the resistor portion 101b2 of the peripheral area 101b may be partially exposed and a third opening (not illustrated) through which the first conductive layer 113 at the peripheral circuit portion 101b1 of the peripheral area 101b may be exposed. For example, the first mask pattern 172 may include a photoresist pattern.

Referring to FIGS. 1 and 6A to 6C, the first conductive layer 113 and the inter-gate dielectric layer 112, which may be exposed through the first to third openings, may be partially removed by an etching process using the first mask pattern 172 as an etching mask. Thus, a butting hole 182a communicating with the first opening 172a may be formed in the cell area 101a of the substrate 101 in which a selection transistor may be formed in a subsequent process. A whole surface of the floating gate pattern may be exposed through the third opening at the peripheral circuit portion 101b1 of the peripheral area 101b.

Particularly, the second opening 172b of the first mask pattern 172 may be formed into a line extending in the first direction x and thus the first conductive layer 113 and the inter-gate dielectric layer 112 may be linearly exposed along the first direction x at the resistor portion 101b2 of the peripheral area 101b. Therefore, the device isolation layer 102 may be linearly exposed at the resistor portion 101b2 of the peripheral area 101b after the removal of the first conductive layer 113 and the inter-gate dielectric layer 112. Thereafter, the device isolation layer 102 may be further etched off using the first mask pattern as an etching mask, thereby forming the recess portion 104 at the device isolation layer 102 at the resistor portion 101b2 of the peripheral area 101b. The recess portion 104 of the device isolation layer 102 may be formed into a line extending in the first direction x corresponding to the shape of the second opening 172b. Thus, the device isolation layer 102 may include a recess space 182b communicating with the second opening 172b and the residuals of the device isolation layer 102 defining the recess space 182b may relatively protrude from the bottom of the recess portion 104. Therefore, the residuals of the device isolation layer 102 except the recess portion 104 may remain without being etched and thus be formed into the protrusion portion 105. That is, the device isolation layer 102 of the resistor portion 101b2 may include the recess portion 104 and the protrusion portion 105.

Therefore, the inter-gate dielectric layer 102 and the first conductive layer 103 may still remain on the protrusion portion 105 of the device isolation layer at the resistor portion 101b2 and the recess portion 104 of the device isolation layer 102 may be exposed to surroundings. That is, the protrusion portion 105 may be covered with the inter-gate dielectric layer 102 and the first conductive layer 103 and the recess portion 104 may be exposed to surroundings.

In the present example embodiment, the recess portion 104 may have a depth d of about 350 Å to about 550 Å from the upper surface of the device isolation layer 102.

Since the floating gate pattern 111c may have sufficient etching selectivity with respect to the device isolation layer 102, the floating gate pattern 111c exposed through the first opening 172a and the third opening may be hardly etched off in the etching process for forming the recess space 182b. However, when the depth d of the recess portion 104 may be over about 550 Å, the floating gate pattern 111c at the cell area 101a and the peripheral circuit portion 101b1 may tend to be etched off simultaneously with the device isolation layer 102 of the resistor portion 101b2. Thus, the depth d of the recess portion 104 may be smaller than about 550 Å. In addition, when the depth of the recess portion 104 may be less than about 350 Å, the difference between the protrusion portion 105 and the recess portion 104 may be so small that the subsequent silicidation process may also be performed to the resistor body 191 in the recess portion 104. That is, the resistor body 191 may tend to be under the silicidation process when the depth of the recess portion is less than about 350 Å. For those reasons, the depth d of the recess portion 104 may be in a range of about 350 Å to about 550 Å.

Accordingly, when the inter-gate dielectric layer 112 and the first conductive layer 113 may have the thickness of about 150 Å to about 300 Å, a stepped difference d2 between an upper surface of the first conductive layer 113 and the bottom of the recess portion 104 may be in a range of about 800 Å to about 1000 Å. The stepped difference d2 may be varied in accordance with the thickness of the inter-gate dielectric layer 112 and the first conductive layer 113, as would be known to one of the ordinary skill in the art.

Referring to FIGS. 1 and 7A to 7C, the first mask pattern 172 may be removed from the first conductive layer 113 and a second conductive layer 114 may be formed on the first conductive layer 113.

For example, the second conductive layer 114 may be formed on the first conductive layer 113 to a sufficient thickness to fill up the butting hole 182a and the recess space 182b. Thereafter, an upper surface of the second conductive layer 114 may be planarized.

Therefore, the second conductive layer 114 may make direct contact with the floating gate pattern 111c through the butting hole 182a for a string selection transistor. The second conductive layer 114 may be formed on the first conductive layer 113 in the cell area 101a except for the area at which the string selection transistor is to be formed. Since the whole surface of the floating gate pattern 111 may be uncovered at the peripheral circuit portion 101b1 of the peripheral area 101b, the second conductive layer 114 may be formed on the whole surface of the floating gate pattern 111. In the resistor portion 101b2 of the peripheral area 101b of the substrate 101, the second conductive layer 114 may be formed on the resistor portion of the peripheral area of the substrate 101 along a surface profile of the recess portion 104. Thus, the first conductive layer 113 and the inter-gate dielectric layer 112 on the protrusion portion 105 and the bottom and sidewalls of the recess portion 104 may be covered with the second conductive layer 114. The second conductive layer 114 may have a stepped difference D corresponding to the stepped difference d2 as the device isolation layer 102 of the resistor portion 101b2.

For example, the second conductive layer 114 may include phosphor-doped polysilicon (P-doped polysilicon). The second conductive layer 114 may improve conductivity of an upper portion of the stack gate structure such as the control gate electrode for a flash memory device in the cell area 101a and may prevent the silicide materials from being diffused into downwards in a subsequent silicidation process.

The second conductive layer 114 may be uniformly formed on a whole surface of the substrate 101 and thus the stepped difference D of the device isolation layer 102 of the resistor portion 102b2 may be transcribed into the second conductive layer 114 at the resistor portion 101b2.

Referring to FIGS. 1 and 8A to 8C, a second mask pattern 174 may be formed on the second conductive layer 114 and an etching process using the second mask pattern 174 as an etching mask may be performed on the resultant substrate, thereby forming a preliminary gate pattern 180a and a preliminary resistor pattern 190a respectively on the cell area 101a and the resistor portion 101b2 of the peripheral area 101b of the substrate 101.

For example, the second mask pattern 174 may include a fourth opening (not illustrated) through which the second conductive layer 114 of the cell area 101a may be exposed, a fifth opening (not illustrated) through which the second conductive layer 114 of the peripheral circuit portion 101b1 of the peripheral area 101b may be exposed and a sixth opening (not illustrated) through which the second conductive layer 114 of the resistor portion 101b2 may be exposed. The fourth opening may be formed into a trench extending in the second direction y substantially perpendicular to the line-shaped active region A and the fifth opening may be formed into a trench extending in a given direction. The sixth opening may be formed into a trench extending in the first direction x.

The second mask pattern 174 may include a material having etching selectivity with respect to the second conductive layer 114 such as silicon nitride. The second mask pattern 174 may include a gate mask or an assembly of the gate mask and a photo mask on the gate mask that may cover the gate pattern in a subsequent process.

The second conductive layer 114, the first conductive layer 113, the inter-gate dielectric layer 112 and the floating gate pattern 111 may be sequentially etched off by an etching process using the second mask pattern 174 as an etching mask, thereby forming the preliminary gate pattern 180a on the active region A and the preliminary resistor pattern 190a on the resistor portion 101b2.

In the cell area 101a of the substrate 101, the second conductive layer 114, the first conductive layer 113, the inter-gate dielectric layer 112 and the floating gate pattern 111c may be sequentially removed from the substrate 101 in such a manner that the tunnel insulation pattern 110c may be exposed along the second direction y. Thus, the floating gate pattern 111c may be node-separated into a plurality of floating gates by the cell in the cell area 101a of the substrate 101. Thus, the line-shaped floating gate pattern 111c may be separated into the floating gates at each cell of the cell area 101a and may be arranged into a matrix shape and regularly spaced apart from one another. Further, the inter-gate dielectric layer 112, the first conductive layer 113 and the second conductive layer 114 may be linearly removed along the second direction y, thereby forming the line-shaped dielectric pattern 112c and the first and second line-shaped conductive patterns 113c and 114c that may extend along the second direction y in the cell area 101a. Thus, the floating gate, the dielectric pattern 112c and the first and the second conductive patterns 113c and 114c may be sequentially stacked at each cell, thereby forming the preliminary gate pattern 180a for a cell transistor.

In the peripheral circuit portion 101b1 of the peripheral area 101b of the substrate 101, the second conductive layer 114 and the floating gate pattern 111 may be sequentially removed from the substrate 101 by an etching process using the second mask pattern 174 as an etching mask in such a manner that the tunnel insulation pattern 110 may be exposed along a given direction. Thus, the floating gate pattern 111 may be node-separated into a plurality of floating gates for a peripheral transistor. The floating gates may also be spaced apart by a gap distance in a given direction. Thus, the floating gate and the second conductive pattern 114 may be sequentially stacked at each cell of the peripheral circuit portion 101b1 of the peripheral area 101b of the substrate 101, thereby forming the preliminary gate pattern 180a in the peripheral circuit portion 101b1 for a peripheral circuit transistor.

In the resistor portion 101b2 of the peripheral area 101b of the substrate 101, the second conductive layer 114, the first conductive layer 113 and the inter-gate dielectric layer 112 may be sequentially removed from device isolation layer 102 of the resistor portion 101b2 in such a manner that the device isolation layer 102 adjacent to the recess portion 104 may be exposed along the first direction x. Thus, the second mask pattern 174 may remain on the second conductive layer 114 on the recess portion 104 and the protrusion portion 105 in the first direction, thereby forming the preliminary resistor pattern 190a on the resistor portion 101b2 of the peripheral area 101b. The inter-gate dielectric layer 112 and the first conductive layer 113 may be removed from the substrate 101 along the first direction and thus just merely on the protrusion portion of the device isolation layer 102 of the resistor portion 101b2, thereby forming the dielectric pattern 112r and the first conductive pattern 113r. The second conductive layer 114 may be formed into a line across the protrusion portion 105 and the recess portion 104 along the first direction x, thereby forming the second conductive pattern 114r.

The preliminary resistor pattern 190a may include a preliminary resistor body 191a corresponding to the second conductive pattern 114r in the recess portion 104 and a preliminary connector 192a having the dielectric pattern 112r and the first and the second conductive patterns 113r and 114r that may be stacked on the protrusion portion of the device isolation layer 102 of the resistor portion 101b2.

Thereafter, a spacer 121 may be formed on sidewalls of the preliminary gate pattern 180a, and an etch stop layer 122 may be formed on the spacer 121. The spacer 121 may include silicon oxide having good insulative characteristics and the etch stop layer 122 may comprise silicon nitride or silicon oxynitride.

Referring to FIGS. 1 and 9A to 9C, a protection pattern 123 may be filled up into a gap space between the neighboring preliminary gate patterns 180a and into the recess space 182b in which the preliminary resistor pattern 190a may be formed.

For example, a protection layer (not illustrated) may be formed on the substrate 101 to a sufficient thickness to fill up the gap space between the neighboring preliminary gate patterns 180a and the recess space 182b including the preliminary resistor pattern 190a. Then, an upper portion of the protection layer may be planarized by a planarization process until the second mask pattern 174 on the preliminary gate pattern 180a and the preliminary resistor pattern 190a may be exposed.

Therefore, the protection layer may remain in the gap space and the recess space 182b in such way that an upper surface of the second mask pattern 174 may be coplanar with the upper surfaces of the preliminary gate pattern 180a and the preliminary resistor pattern 190a, thereby forming the protection pattern 123 on the substrate 101.

For example, the protection layer may include a material having good gap-fill and insulative characteristics, such as tetra ethyl ortho-silicate (TEOS) deposited by plasma enhanced CVD process to form plasma enhanced tetra ethyl ortho-silicate (PETEOS). Thus, the gap space between the preliminary gate patterns 180a and the recess space 182b of the recess portion 104 may be sufficiently filled up with the protection pattern 123 with good electrical insulation from surroundings. The planarization process may include a chemical mechanical polishing (CMP) process and an etch-back process.

Figure 10A:
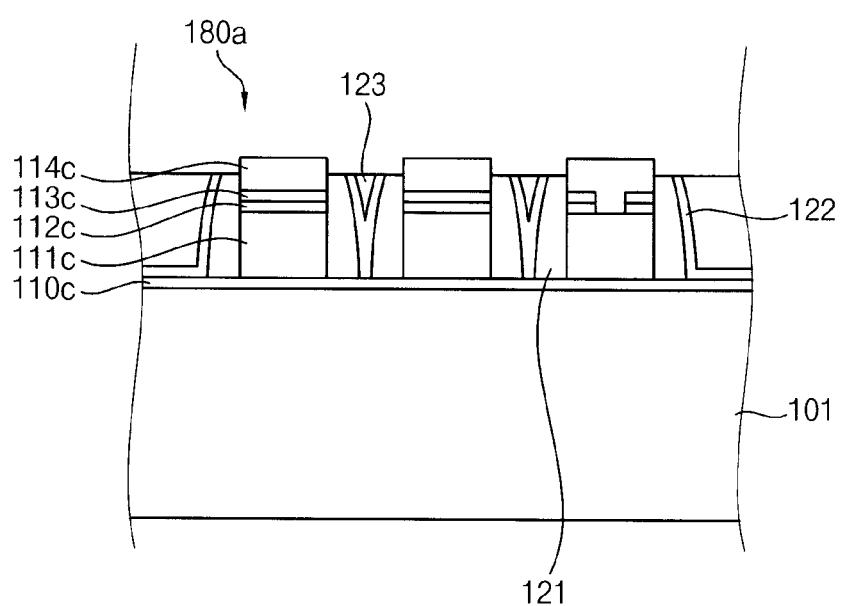
Figure 10B:
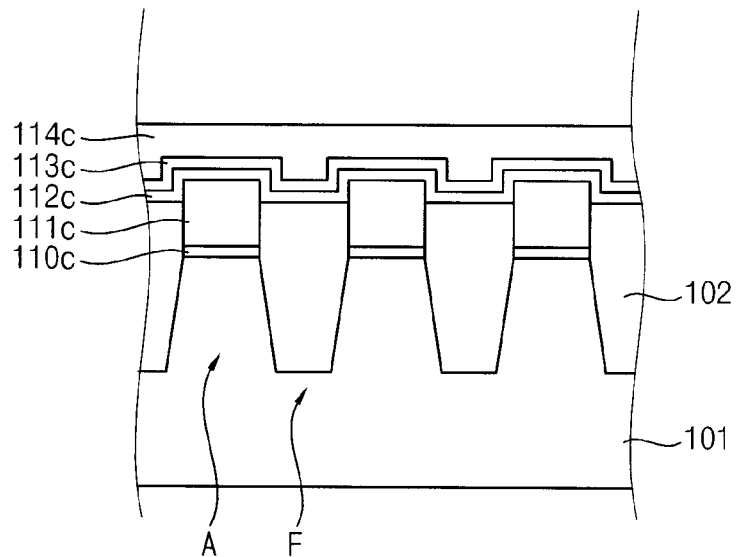
Figure 10C:
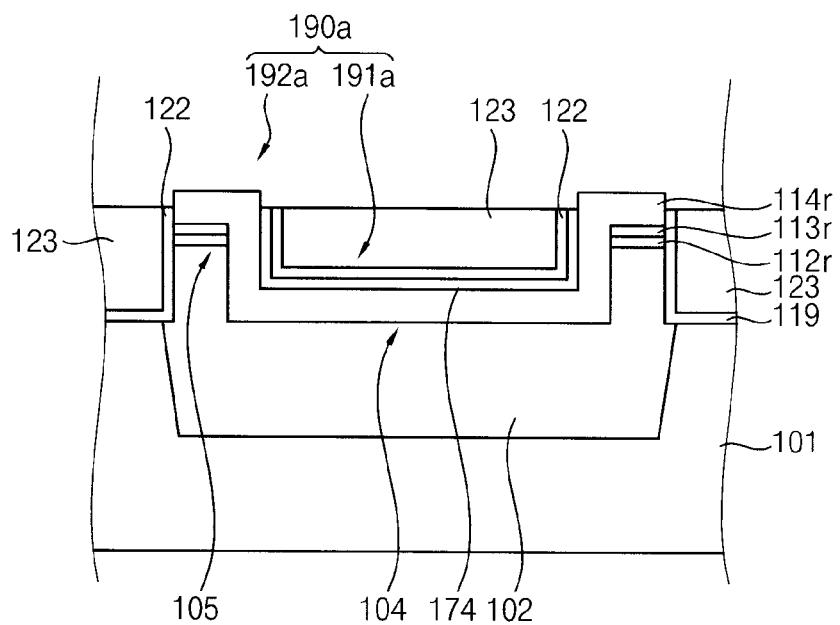
Figure 11A:
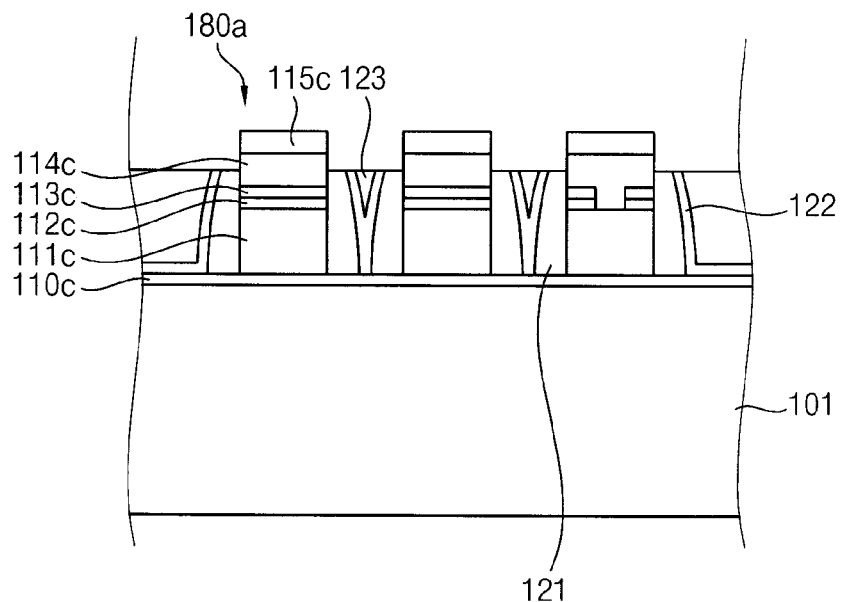
Figure 11B:
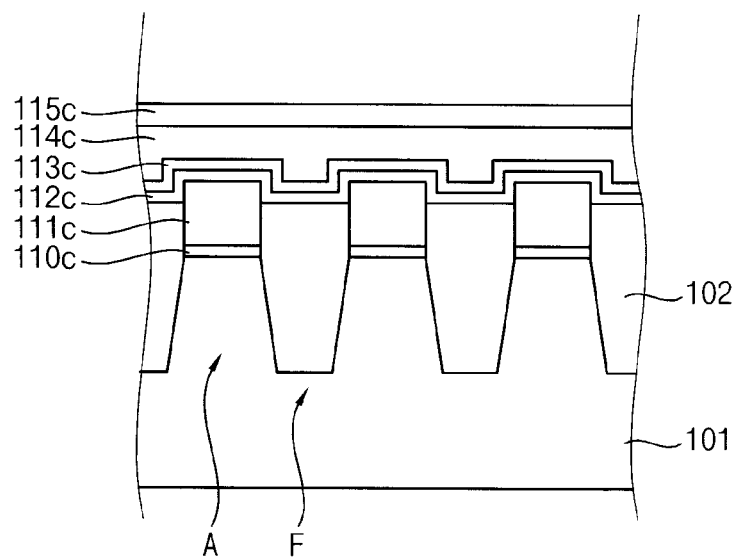
Figure 11C:
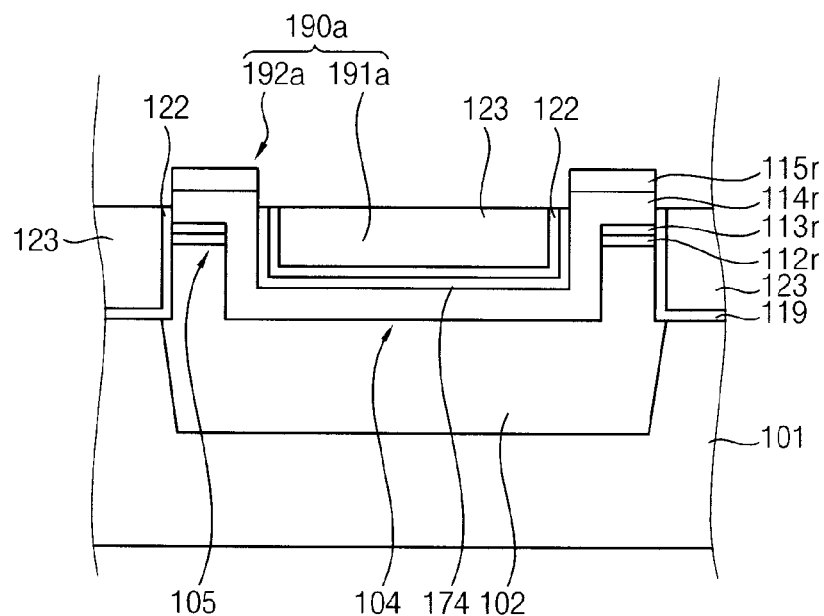
Figure 12A:
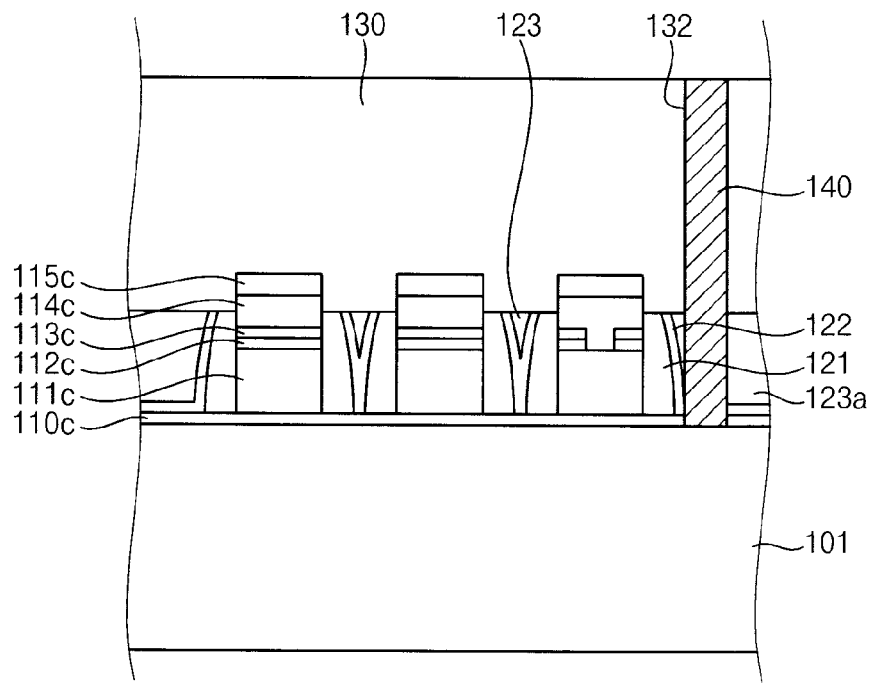
Figure 12B:
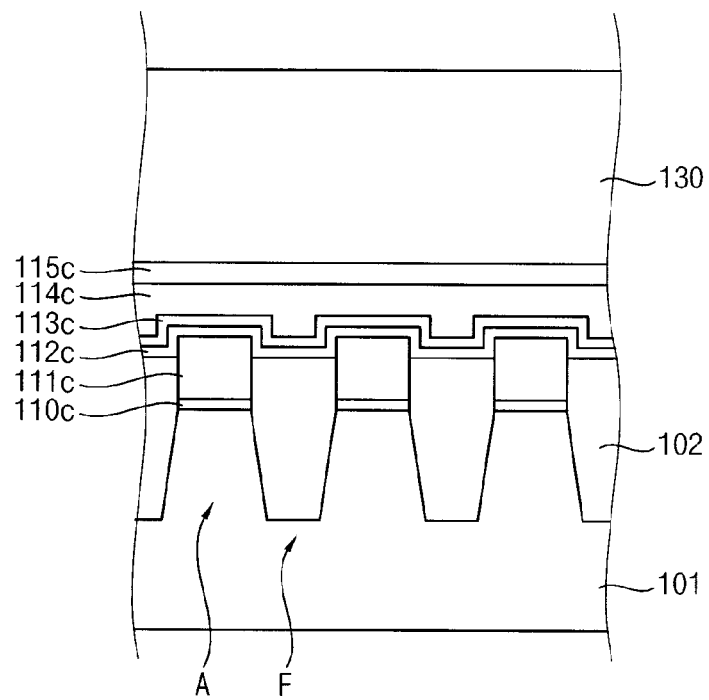
Figure 12C:
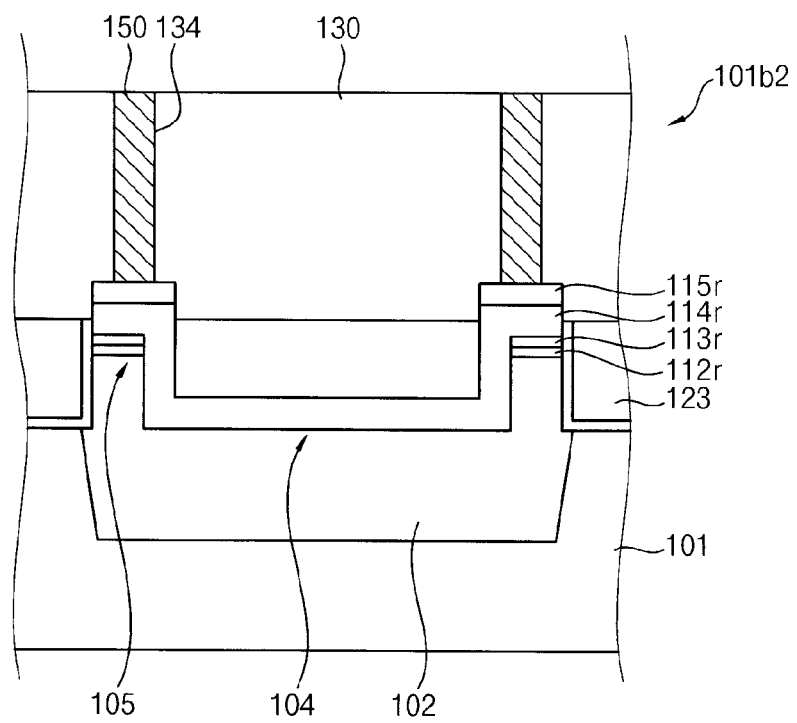

Referring to FIGS. 1 and 10A to 10O, the protection pattern 123 and the second mask pattern 174 may be partially removed, thereby exposing the second conductive pattern 114c of the preliminary gate pattern 180a and the second conductive pattern 114r of the preliminary resistive pattern 190a.

For example, an upper portion of the protection pattern 123 and the etch stop layer 122, the second mask pattern 174 and an upper portion of the spacer 121 may be removed from the substrate 101 in such a degree that an upper portion of the second conductive pattern 114 may be exposed at the active region A and the resistor portion 101b2 of the preliminary area 101b of the substrate 101.

A planarization process and/or etching process may be used for removing the protection pattern 123, the etch stop layer 122, the second mask pattern 174 and the spacer 121. The planarization process may include a chemical mechanical polishing (CMP) process, a chemically enhanced polishing (CEP) process and an etch-back process. The etching process may include dry and wet etching processes.

The gap space between the neighboring preliminary gate pattern 180a may still be filled with the protection pattern 123, the etch stop layer 122 and the spacer 121, and the recess space 182b may still be filled with the protection pattern 123, the etch stop layer 122 and the second mask pattern 174. Thus, the second conductive pattern 114c formed on the preliminary gate pattern 180a and on the preliminary connector 192a may protrude from the planarized protection pattern 123, the etch stop layer 122 and the spacer 121. Further, the second conductive pattern 114r formed on the bottom of the recess portion 104 may still be covered with the protection pattern 123, the etch stop layer 122 and the second mask pattern 174.

Referring to FIGS. 1 and 11A to 11C, a metal silicide pattern 115 may be formed on the exposed second conductive pattern 114.

For example, a metal layer (not illustrated) may be formed on the whole substrate 101 along a surface profile of the protruded second conductive pattern 114, and thus the metal layer may be formed on the protection pattern 123, the etch stop layer 122 and the spacer 121 while covering the protruded second conductive pattern 114c in the active region A of the substrate 101. The metal layer may also be formed on the protection pattern 123, the etch stop layer 122 and the second mask pattern 174 while covering the protruded second conductive pattern 114r in the resistor portion 101b2 of the peripheral area 101b of the substrate 101.

For example, the metal layer comprise low-resistive materials such as cobalt (Co), nickel (Ni), tungsten (W), aluminum (Al), titanium (Ti) and tantalum (Ta).

A heat treatment may be performed on the metal layer. Thus, a silicide reaction may be initiated between the metal and the second conductive pattern 114 due to the heat. Since the second conductive pattern 114 may include polysilicon and the protection pattern 123, the etch stop layer 122, the spacer 121 and the second mask pattern 174 may include oxide or nitride, the silicidation reaction may be processed just merely at the upper portion of the second conductive pattern 114. For example, the heat treatment may be performed by rapid thermal process (RTP). Accordingly, the exposed second conductive pattern 114 may react with the metal layer by the silicidation process, thereby forming the metal silicide pattern 115c on the preliminary gate pattern 180a in the active region A and the metal silicide pattern 115r on the preliminary connector 192a in the resistor portion of the peripheral area 101b.

Accordingly, the preliminary gate pattern 180a may be formed into the gate pattern 180 in which the floating gate pattern 111c, the dielectric pattern 112c, the first and the second conductive pattern 113c and 114c and the metal silicide pattern 115c may be stacked on the active region A of the substrate 101. Further, the preliminary connector 192a of the resistor portion 101b2 may be formed into the connector 192 in which the dielectric pattern 112r, the first and the second conductive patterns 113r and 114r and the metal silicide pattern 115r on the protrusion portion of the device isolation layer 102 in the resistor portion 101b2 of the peripheral area 101b. The preliminary resistor body 191a corresponding to the second conductive pattern 114r at the bottom of the recess portion 104 may be covered with the protection pattern 123, the etch stop layer 122 and the second mask pattern 174, and thus the preliminary resistor body 191a may be protected from the silicidation. Accordingly, the electric resistance of the preliminary resistor body 191a may not be deteriorated by the silicidation process. The preliminary resistor body 191a may be formed into the resistor body 191 after the heat treatment for the silicidation process.

Thereafter, the residuals of the metal layer that may not be processed with the silicidation process may be removed, and thus the protection pattern 123, the etch stop layer 122, the spacer 121 and the second mask pattern 174 may be exposed again.

The first and the second conductive patterns 113c and 114c and the metal silicide pattern 115c in the cell area 101a may extend in the second direction y, thereby forming the SSLs, WLs and GSLs of the flash memory device. The dielectric pattern 112r, the first and the second conductive patterns 113r and 114r and the metal silicide pattern 115r may be formed into the connector 191 of the resistor pattern 190 at the protrusion portion 105 of the device isolation layer 102 at the resistor portion 101b2 of the peripheral area 101b. In addition, the second conductive pattern 114r at the bottom of the recess portion 104 may be formed into the resistor body 192 of the resistor pattern 190.

Referring to FIGS. 1 and 12A to 12C, an insulation interlayer 130 may be formed on the metal silicide pattern 115 and the protection pattern 123 and the wiring interconnection 140 and the resistor interconnection 150 may be formed through the insulation interlayer 130.

For example, a preliminary insulation interlayer (not illustrated) may be formed on the substrate 101 including the metal silicide pattern 115 and the protection pattern 123 to a sufficient thickness to cover the protection pattern 123, the etch stop layer 122 and the second mask pattern 174 and then an upper portion of the preliminary insulation interlayer may be planarized.

Then, a plurality of contact holes may be formed through the insulation interlayer 130. A first hole 132 may be formed through the insulation interlayer 130 in the active region A of the substrate 101 and thus the protection pattern 123 may be partially exposed through the first hole 132 in the active region A. A second hole 134 may be formed through the insulation interlayer 130 at the resistor portion 101b2 of the peripheral area 101b of the substrate 101. Thus, the metal silicide pattern 115r of the connector 192 may be exposed through the second hole 134. The protection pattern 123 and the tunnel insulation layer 110c under the protection pattern 123 exposed through the first hole 132 may be etched off, thereby forming a contact hole 123a through which the active region A of the substrate 101 may be partially exposed. In such a case, the etch stop layer 122 may prevent the over etching against the substrate 101.

A conductive pattern may be filled into the first hole 132 and the contact hole 123a communicating with the first hole by consecutive processes of deposition and planarization, thereby forming the wiring interconnection 140. Further, conductive pattern may also be filled into the second hole 134 simultaneously with the wiring interconnection 140, thereby forming the resistor interconnection 150.

The conductive pattern may comprise the same metal as the metal silicide pattern 115. For example, when the metal silicide pattern 115 may comprise cobalt silicide, the wiring interconnection 140 and the resistor interconnection 150 may comprise cobalt (Co). In the present example embodiment, the wiring interconnection 140 may include a bit line contact plug adjacent to the string selection transistor.

Accordingly, since the resistor interconnection 150 and the connector 192 of the resistor pattern 190 may include the same metal, the contact resistance Rc between the resistor interconnection 150 and the connector 192 may be sufficiently reduced. Therefore, the resistance of the resistor pattern 190 may be sufficiently stable and reliable and thus the reference voltage may be stably applied to the cell transistors.

Thereafter, additional wring structures (not illustrated) may be formed on the insulation interlayer 130 and a passivation layer (not illustrated) may be formed on the additional wiring structure, to thereby manufacturing the non-volatile memory device 1000.

Figure 13:
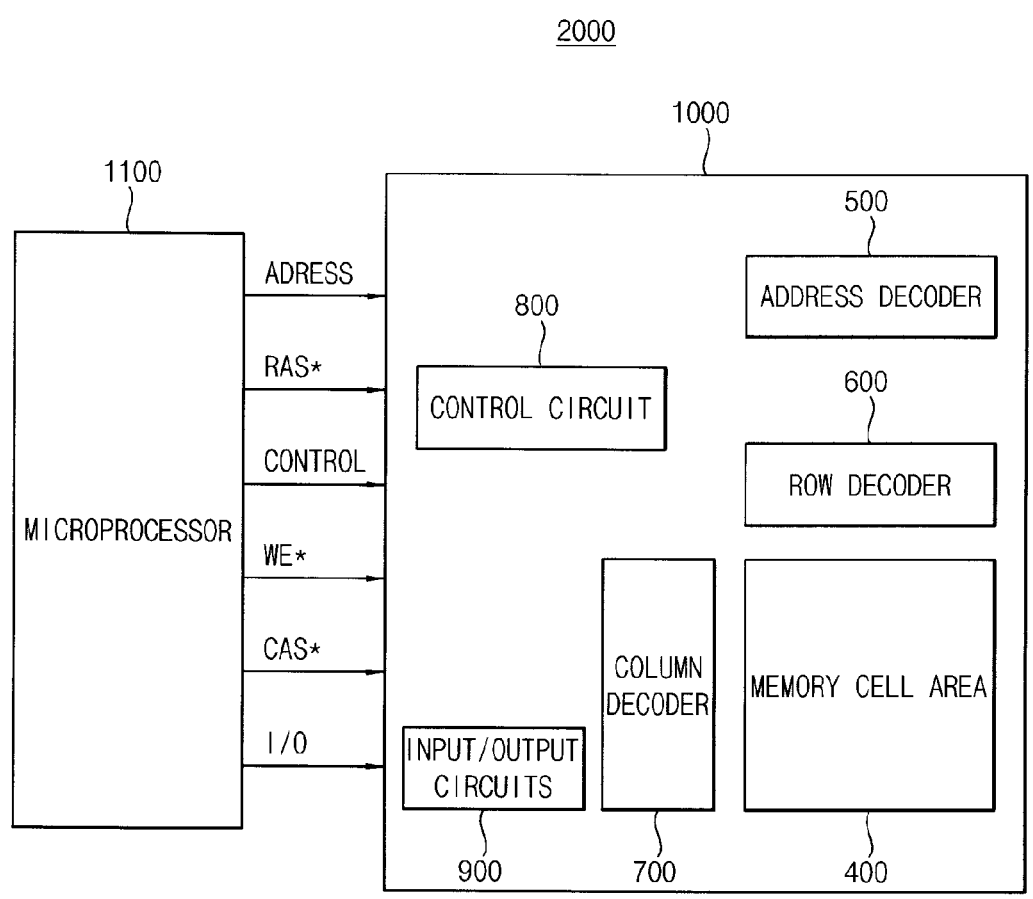
FIG. 13 is a view illustrating an integrated circuit system including the integrated circuit device of FIG. 1.

FIG. 13 is a view illustrating an integrated circuit system including the integrated circuit device of FIG. 1.

Referring to FIG. 13, an integrated circuit system 2000 in accordance with an example embodiment of the present inventive concept may include the integrated circuit device 1000 illustrated in FIG. 1 and an external microprocessor 1100 to control the integrated circuit device 1000.

The integrated circuit device 1000 may include a plurality of cell transistors arranged as a matrix shape in a memory cell area 400 and a plurality of peripheral transistors arranged in a peripheral area around the memory cell area 400. The cell transistors may be operated by the peripheral transistors. For example, an address decoder 500, row and column decoders 600 and 700, a control circuit 800 and input/output circuits 900 may be provided around the memory cell area 400. The resistor pattern 900 of an example embodiment of the present inventive concept may be provided with the control circuit 800 and the input/output circuit 900, and thus the connector 192 including the metal silicide at an upper portion thereof may be positioned relatively higher than the resistor body 191 by a stepped portion between the connector 192 and the resistor body 191. The metal silicide of the connector 191 may have the same metal as the resistor interconnection, and thus the contact resistance Rc of the resistor pattern 190 and the resistor interconnection may be minimized and the reference voltage may be applied to the cell transistors with high reliability in the integrated circuit system 2000.

The integrated circuit device 1000 may be controlled by a microprocessor 1100. The microprocessor 1100 may applies various control signals such as an address signal and input/output signals to the integrated circuit device 1000 and thus various data may be communicated with the integrated circuit device 1000 by the microprocessor 1100.

Additional circuit devices and signals may be further provided with the integrated circuit system 2000 in accordance with the system requirements of the integrated circuit system 2000.

Figure 14:
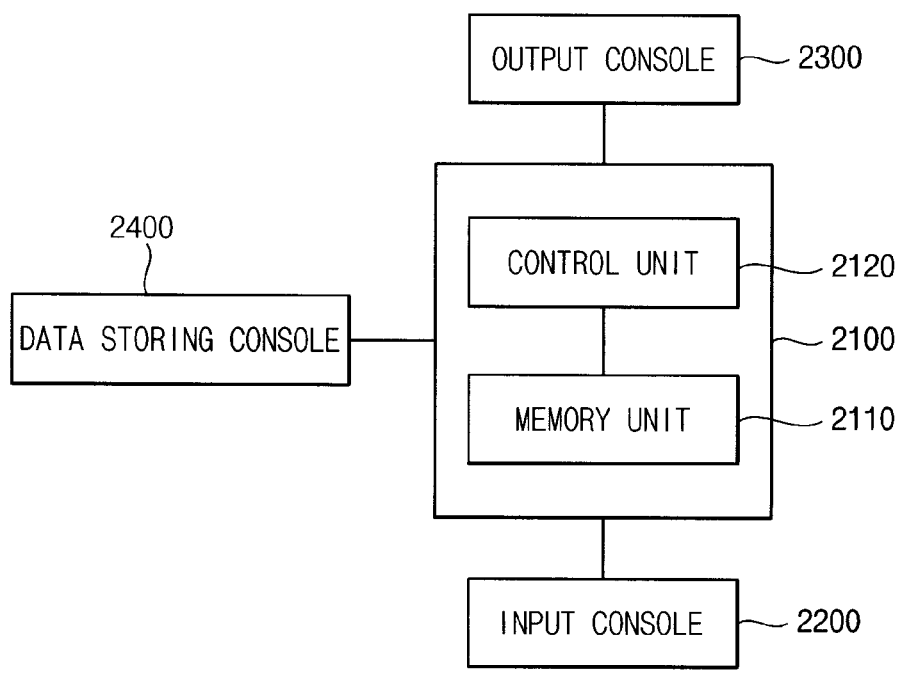
FIG. 14 is a view illustrating an electronic instrument including the integrated circuit system of FIG. 13.

FIG. 14 is a view illustrating an electronic instrument including the integrated circuit system of FIG. 13.

Referring to FIG. 14, an electronic instrument 3000 in accordance with an example embodiment of the present inventive concept may include a data processor 2100, an input console 2200, an output console 2300 and a data storing console 2400. The data processor 2100 may include a memory unit 2110 having the integrated circuit system illustrated in FIG. 13 and a control unit 2120 for controlling the memory unit 2110.

The memory unit 2110 may include the integrated circuit system illustrated in FIG. 13, and thus the reference voltage may be stably applied to the cell transistors with high reliability and the cell transistors may be stably operated in data programming, erasing and reading mode. While the present example embodiment discloses a NAND flash memory device as the memory unit 2110, any other memory devices such as NOR flash memory device and other memory devices including the resistor pattern 190. The control unit 2120 may include a digital signal processor such as a microprocessor, a digital signal processor and a micro controller. The control unit 2120 may control the memory unit 2120 to communicate data signals with the input console 2200, the output console 2300 and the data storing console 2400.

While the memory unit 2110 and the control unit 2120 may be individually manufactured independently from each other and may be electrically connected to each other, any other modifications known to one of the ordinary skill in the art may also be allowable for the data processor 2100. For example, the memory unit 2110 and the control unit 2120 may be assembled into a single data process package. In such a case, the data processing time may be reduced between the memory unit 2110 and the control unit 2120.

The input console 2200 and the output console 2300 may include a keypad, keyboard, a monitor and a flat panel display device. In addition, any other user interface may be further provided with the electronic instrument 3000 such as a MODEM, a graphic driver card and an additional storing console.

The electronic instrument 3000 may include a computer system such as a desk top computer, a lap-top computer and a tablet computer and a portable electronic device and a wireless communication device such as a mobile phone including as a cellular phone and a smart phone, a PDA, a digital music player and an interface protocol for communication.

According to the example embodiments of the present inventive concept, the recess portion may be formed on the bulk-type device isolation layer at the resistor portion of the peripheral area of the substrate and the resistor pattern may be provided with the bulk-type device isolation layer in such a configuration that the resistor body is positioned at the bottom of the recess portion and the connector having the metal silicide pattern at an upper portion thereof is positioned on the surface of the bulk-type device isolation layer around the recess portion consecutively to the resistor body. Thus, the connector and the resistor body may have a stepped portion therebetween due to the recess portion of the bulk-type device isolation layer. The metal silicide pattern of the connector may include the same metal as the resistor interconnection and thus the contact resistance between the resistor pattern and the resistor interconnection may be minimized. Therefore, the variation of the contact resistance may be reduced without deterioration of the sheet resistance of the resistor body and thus the electric resistance of the wiring pattern 190 may become stable. As a result, the reference voltage may be stably applied to the cell transistors with high reliability.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing an integrated circuit device, comprising:
   preparing a substrate having an active region defined by a device isolation layer;
   forming a resistor pattern on the device isolation layer, the resistor pattern including a resistor body positioned in a recess portion of the device isolation layer and at least a connector making contact with the resistor body and positioned on the device isolation layer around the recess portion, the connector having a metal silicide pattern having electric resistance lower than that of the resistor body at an upper portion thereof;
   forming a gate pattern on the active region of the substrate, the gate pattern including the metal silicide pattern at an upper portion thereof; and
   forming a resistor interconnection making contact with the connector of the resistor pattern,
   wherein the connector and the resistor interconnection are made of a same metal so as to reduce contact resistance therebetween.

2. The method of claim 1, wherein a plurality of the gate patterns is formed on a cell area of the substrate in which a plurality of cell transistors is formed and on a peripheral circuit portion of a peripheral area of the substrate in which a plurality of peripheral transistors electrically connected to the cell transistor is formed, and the resistor pattern is formed on a resistor portion of the peripheral area of the substrate simultaneously with the gate pattern.

3. The method of claim 2, wherein forming the resistor pattern includes:
   forming the device isolation layer on a field region of the substrate and a tunnel insulation pattern and a floating gate pattern on the active region of the substrate in such a manner that the device isolation layer and the tunnel insulation pattern and a floating gate pattern are shaped into a line and a sidewall of the floating gate pattern is exposed over the device isolation layer in the cell area and the device isolation layer is formed into a bulk shape in the resistor portion of the peripheral area of the substrate;
   sequentially forming a dielectric layer and a first conductive layer on the floating gate pattern and the device isolation layer;
   partially removing the bulk-shaped device isolation layer at the resistor portion of the peripheral area of the substrate while partially exposing the floating gate pattern on the active region of the substrate, thereby forming the recess portion on the bulk-shaped device isolation layer;

forming a second conductive layer on the cell area and the peripheral area of the substrate along a surface profile thereof;

patterning the second conductive layer, the first conductive layer and the dielectric layer, thereby forming a preliminary gate pattern on the active region of the substrate and forming a preliminary resistor pattern on the bulk-shaped device isolation layer, the preliminary resistor pattern including a preliminary resistor body at a bottom of the recess portion and a preliminary connector on the bulk-shaped device isolation pattern around the recess portion thereof; and forming a metal silicide pattern on the preliminary gate pattern and the preliminary resistor pattern, so that the resistor pattern on the resistor portion of the peripheral area of the substrate is formed simultaneously with the gate pattern on the active region of the substrate.

4. The method of claim 3, wherein forming the device isolation layer includes:

etching the substrate on which the tunnel insulation layer and the floating gate layer are stacked by a self-aligned process, thereby forming a trench in the field region of the substrate simultaneously with the tunnel insulation pattern and the floating gate pattern defined by the trench;

filling up the trench with insulation materials, thereby forming the device isolation layer in the trench; and partially removing an upper portion of the device isolation layer in the cell area of the substrate, thereby exposing the sidewall of the floating gate pattern over the device isolation layer in the cell area of the substrate.

5. The method of claim 3, wherein partially removing the bulk-shaped device isolation layer includes:

forming a first mask pattern on the first conducive layer, the first mask pattern including a plurality of openings through which the first conductive layer is partially exposed on the active region and the resistor portion of the peripheral area of the substrate, respectively; and sequentially removing the first conductive layer, the dielectric layer and the bulk-shaped device isolation layer by a first etching process using the first mask pattern as an etching mask at the resistor portion of the peripheral area while simultaneously removing the first conductive layer and the dielectric layer at the active region of the substrate by the first etching process, so that the recess portion is formed on the bulk-shaped device isolation layer at the resistor portion of the peripheral area and the floating gate pattern is partially exposed at the active region of the substrate.

6. The method of claim 5, wherein the first mask pattern includes a first opening through which the floating gate pattern corresponding to a string selection transistor is exposed in the cell area, a second opening through which the floating gate pattern corresponding to the peripheral transistor is exposed in the peripheral circuit portion of the peripheral area and a third opening through which a central portion of the bulk-shaped device isolation layer is exposed.

7. The method of claim 6, wherein the second conductive layer is formed into a control gate of a stack gate pattern together with the first conducive layer in the cell area while the second conductive layer making contact with the floating gate pattern through the first opening is formed into the string selection transistor and the second conductive layer making contact with the floating gate pattern through the second opening is formed into the peripheral transistor.

8. The method of claim 3, wherein patterning the second conductive layer, the first conductive layer and the dielectric layer includes:

forming a second mask pattern on the second conductive layer; and sequentially performing a dry etching process against the second conductive layer, the first conductive layer and the dielectric layer using the second mask pattern as an etching mask, thereby forming the preliminary gate pattern and the preliminary resistor pattern.

9. The method of claim 8, wherein forming the metal silicide pattern includes:

forming a protection layer to cover the preliminary gate pattern and the preliminary resistor pattern;

planarizing the protection layer until the preliminary gate pattern and the preliminary resistor pattern are exposed, thereby forming a protection pattern from which a second conductive pattern is protruded;

forming a metal layer on the protection pattern such that the second conductive pattern is covered with the metal layer; and performing a heat treatment to the metal layer, thereby forming the metal silicide layer on the second conductive pattern.

10. The method of claim 9, before forming the protection layer, further comprising:

forming spacers on sidewalls of the preliminary gate pattern and the preliminary resistor pattern; and forming an etch stop layer on the preliminary gate pattern, the preliminary resistor pattern, the tunnel insulation layer and the etch stop layer.

11. The method of claim 9, wherein the protection layer comprises tetra ethyl ortho silicate deposited by plasma enhanced chemical vapor deposition process (PETEOS).

12. The method of claim 9, wherein planarizing the protection layer is performed by one of a chemical mechanical polishing (CMP) process, a chemically enhanced polishing (CEP) process and an etch-back process.

13. The method of claim 9, wherein the metal layer includes at least a material selected from the group consisting of tungsten (W), nickel (Ni), cobalt (Co), titanium (Ti), tantalum (Ta) and combinations thereof.

14. The method of claim 9, wherein forming the resistor interconnection includes:

forming an insulation interlayer on the protection pattern and the metal silicide pattern;

patterning the insulation interlayer, thereby forming an opening through which the metal silicide pattern on the connector is exposed; and forming a first conductive pattern in the opening, the first conductive pattern making contact with the metal silicide pattern of the connector.

15. The method of claim 14, further comprising forming a second conductive pattern making contact with the active region of the substrate through the insulation interlayer, wherein the second conductive pattern is formed simultaneously with the first conductive pattern.

16. A method of manufacturing an integrated circuit device, comprising:

forming one or more device isolation layers on a cell area and a peripheral area of a substrate;

forming a resistor pattern having a resistor body having a first electric resistance and a connector having a second electric resistance lower than the first electric resistance, on the device isolation layers of a resistor portion of the peripheral area of the substrate; and forming a resistor interconnection to contact the connector of the resistor pattern to reduce a contact resistance therebetween, wherein the forming of the one or more device isolation layers on the peripheral layer of the substrate comprises:

forming a recess portion and a protrusion portion in the respective device isolation layers;

forming the resistor body on the recess portion and the protrusion portion; and forming the connector on the protrusion portion to have a depth of recess with the resistor body in the recess portion, wherein the connector and the resistor interconnection are made of a same metal so as to reduce contact resistance therebetween.

17. The method of claim 16, further comprising:

forming one or more gate patterns on active regions of the cell area of the substrate, wherein the forming of the device isolation layers in the cell area comprises forming the device isolation layers in field regions of the cell area between the adjacent active regions.

18. The method of claim 17, wherein the forming of the gate patterns comprises forming a floating gate pattern of the gate pattern to be disposed between the device isolation layers such that an upper portion of the floating gate pattern of the gate pattern is exposed from an upper portion of one or more the device isolation layers.

* * * * *